United States Patent [19]
Sugai

[11] Patent Number: 6,123,992
[45] Date of Patent: Sep. 26, 2000

[54] METHOD OF FORMING ALUMINUM INTERCONNECTION LAYER

[75] Inventor: Kazumi Sugai, Tokyo, Japan

[73] Assignee: NEC Corporation, Tokyo, Japan

[21] Appl. No.: 09/188,381

[22] Filed: Nov. 10, 1998

[30] Foreign Application Priority Data

Nov. 10, 1997 [JP] Japan ................................ 9-321957

[51] Int. Cl.⁷ ........................ C23C 16/20; H01L 21/4763
[52] U.S. Cl. .................. 427/250; 427/255.7; 427/383.3; 204/192.17; 438/632; 438/637; 438/681; 438/688
[58] Field of Search ................................ 427/250, 383.3, 427/255.7; 204/192.17; 438/675, 688, 637, 681, 682

[56] References Cited

U.S. PATENT DOCUMENTS

| | | | |
|---|---|---|---|
| 5,877,087 | 3/1999 | Mosely et al. | 438/656 |
| 5,963,835 | 10/1999 | Sandhu et al. | 438/681 |
| 5,970,377 | 10/1999 | Park | 438/643 |
| 5,981,382 | 11/1999 | Konecni et al. | 438/646 |
| 5,985,751 | 11/1999 | Koyama | 438/637 |

FOREIGN PATENT DOCUMENTS

| | | |
|---|---|---|
| 7-142479 | 6/1995 | Japan . |
| 8-204004 | 8/1996 | Japan . |
| 8-293552 | 11/1996 | Japan . |
| 8-298288 | 11/1996 | Japan . |
| 9-172085 | 6/1997 | Japan . |
| 9-275142 | 10/1997 | Japan . |

*Primary Examiner*—Roy V. King
*Attorney, Agent, or Firm*—Young & Thompson

[57] ABSTRACT

A method of forming an aluminum-based layer mainly including aluminum on a surface of an insulating layer and within a hole formed in the insulating layer. The method includes the steps of: carrying out a chemical vapor deposition to deposit the aluminum-based layer on the surface of the insulating layer and also to incompletely fill the hole to not less than 75% by volume of the hole by use of a source including at least one of alkyl groups and hydrogen so that a surface of the aluminum-based layer is terminated by the at least one of alkyl groups and hydrogen included in the source, and so that the surface of the aluminum-based layer is free of any natural oxide film; and carrying out a heat treatment, without formation of any natural oxide film on the surface of the aluminum-based layer, for causing a re-flow of the aluminum-based layer, whereby the at least one of alkyl groups and hydrogen promotes a migration of aluminum atoms on the surface of the aluminum-based layer.

114 Claims, 30 Drawing Sheets

METHOD OF FORMING ALUMINUM INTERCONNECTION LAYER

BACKGROUND OF THE INVENTION

The present invention relates to a method of forming a semiconductor device, and more particularly to a method of forming an aluminum interconnection layer extending not only over an insulating layer or an inter-layer insulator but also within a contact hole, a through hole or a via hole formed in the insulating layer or the inter-layer insulator.

In semiconductor devices such as intenerated circuits (ICs) and large scale integrated circuits (LSIs), contact holes and through holes are formed in an insulating layer and an inter-layer insulator for filling a conductive material such as aluminum within the contact holes and the through holes and subsequent forming of an interconnection layer which extends over the insulating layer and the inter-layer insulator so that the interconnection layer is in contact with the conductive material such as aluminum within the contact holes and the through holes.

As the requirements for further increase in high integration of the integrated circuits and for further improvement in high speed performances thereof have been on the increase, the required design rule is scaled down, whereby diameters of the contact holes and the through holes are also required to be reduced. This reduction in diameters of the contact holes and the through holes causes further increase in aspect ratio of the contact holes and the through holes. An aspect ratio is defined to be a ratio of a thickness of the inter-layer insulator to the diameter, wherein the contact holes or the through holes are formed in the inter-layer insulator.

Typical two available methods for filling an aluminum into the contact holes or the through holes have been known in the art. A first method is a chemical vapor deposition method. A second method is a physical vapor deposition method such as a sputtering method.

The chemical vapor deposition method can obtain such a good step coverage as to permit an aluminum layer to be deposited not only to extend over the inter-layer insulator but also to fill the contact holes or the through holes. The aluminum layer deposited by the chemical vapor deposition method is likely to be deteriorated in morphology so that a void is formed in the aluminum layer filled with the contact holes or the through holes.

FIG. 1 is a fragmentary cross sectional elevation view illustrative of an aluminum layer formed by the conventional chemical vapor deposition, wherein the aluminum layer not only extends over an inter-layer insulator but also is filled within a contact hole and a void is formed in the aluminum layer within the contact hole. An inter-layer insulator 62 is formed on the silicon substrate 61. A contact hole 63 is formed in the inter-layer insulator 62 so as a part of the surface of the silicon substrate 61 is shown through the contact hole 63. An aluminum layer 64 is deposited by a chemical vapor deposition method so that the aluminum layer 64 not only extends over the inter-layer insulator 62 but also is filled within the contact hole 63, wherein a void 65 is formed in the aluminum layer 64 within the contact hole 63.

The inter-layer insulator is often formed which extends over a step-shaped surface which has been formed by a patterning of an lower level interconnection layer on an insulating layer. If the contact hole is formed in the inter-layer insulator so that the contact hole is displaced and positioned over the step, then the aluminum layer formed within the displaced contact hole may have a void, whereby an aluminum contact layer within the displaced contact hole may no longer have a reliability in connection.

In order to solve the above problems, it was proposed to carry out the chemical vapor deposition processes of aluminum two times, wherein following each chemical vapor deposition process, a high pressure reflow process is carried out to collapse the voids. This second conventional method is disclosed in Japanese laid-open patent publication No. 8-293552. FIGS. 2A and 2B are fragmentary cross sectional elevation views illustrative of a second conventional method wherein chemical vapor deposition processes of aluminum are carried out two times to form an aluminum interconnection layer out only extending over an inter-layer insulator but also fills within a contact hole which is, however, displaced so that the contact hole is positioned over a step formed by an edge of a bottom level interconnection over a substrate.

With reference to FIG. 2A, a bottom level interconnection 71 is formed on a substrate. An inter-layer insulator 72 is formed which extends over the bottom level interconnection 71 and the substrate so that the bottom level interconnection 71 is completely buried within the inter-layer insulator 72. A contact hole 73 is formed in the inter-layer insulator 72. However, the contact hole 73 is displaced so that the contact hole 73 is positioned over a step formed by an edge of the bottom level interconnection 71. A first aluminum layer 74 is deposited by a first chemical vapor deposition process. A first high pressure reflow process is subsequently carried out at a temperature of 400° C. under a pressure of not less than 600 MPa, whereby the first aluminum layer 74 is pushed down to a deep portion of the contact hole having a high aspect ratio.

With reference to FIG. 2B, a second aluminum layer 75 is deposited by a second chemical vapor deposition process. A second high pressure reflow process is subsequently carried out thereby the contact hole having the high aspect ratio is completely filled by the laminations of the first and second aluminum layers 74 and 75 without forming any void. As a result, a void free aluminum contact is formed within the contact hole having the high aspect ratio.

FIGS. 3A and 3B are fragmentary cross sectional elevation views illustrative of a first conventional sputtering method for forming an aluminum interconnection layer not only extending over an inter-layer insulator but also fills within a through hole formed in the inter-layer insulator.

With reference to FIG. 3A, an inter-layer insulator 82 is formed on a silicon substrate 81. A through hole 83 having a high aspect ratio is formed in the inter-layer insulator 82. An aluminum layer 84 is deposited by a sputtering method which extends not only over the inter-layer insulator 82 but also in the through hole 83. However, the sputtering method is inferior in step coverage, for which reason the aluminum layer 84 does not fill the through hole 83.

With reference to FIG. 3B, a reflow process is carried out to the deposited aluminum layer 84 so that the deposited aluminum layer 84 fills the through hole 83 whilst a depression is formed on the re-flowed aluminum layer over the through hole 83, because a moving distance of aluminum atoms is small when the sputtering method is used whereby only aluminum atoms in the vicinity of the through holes may move into the through hole 83. For the above reasons, the sputtering method is applicable only to the through hole of a low aspect ratio of not higher than 3. Further, the above sputtering method is inapplicable to when the inter-layer insulator is made of a dielectric having a low thermal stability. Generally, the dielectric having a high dielectric constant has a high dielectric constant and the dielectric having a low dielectric contact has a low dielectric constant. Thus, the sputtering method is applicable to only the dielectric having a high dielectric constant. If, however, the dielectric having a high dielectric constant is used for the inter-layer insulator, then a problem with a large parasitic capacitance between interconnections separated by the inter-layer insulator may be raised. This large parasitic capacitance between interconnections separated by the inter-layer insulator causes a delay in transmission of signals on the interconnections.

In Japanese laid-open patent publication No. 7-130851, it is disclosed to solve the above problems. FIGS. 4A through 4D are fragmentary cross sectional elevation views illustrative of a second conventional sputtering method for forming an aluminum interconnection not only extending over an inter-layer insulator but also fills a contact hole formed in the inter-layer insulator.

With reference to FIG. 4A, a base interconnection 91 is formed on a silicon substrate. An inter-layer insulator 93 is formed over the base interconnection 91 and over the silicon substrate so that the base interconnection 91 is completely buried within the inter-layer insulator 93. A contact hole 92 is formed in the inter-layer insulator 93 so that the contact hole 92 is positioned over the base interconnection 91 whereby a part of the base interconnection 91 is shown through the contact hole 92. A base layer 94 is deposited which extends over the top surface of the inter-layer insulator 93 and also extends on vertical walls of the contact hole 92 and the bottom of the contact hole 92. The base layer 92 has a property for facilitation of application of an aluminum-based material. Subsequently, a sputtering process is carried out to deposit an aluminum-based thin layer 95 on the base layer 94 except on the vertical wall of the contact hole 92.

With reference to FIG. 4B, a heat treatment is carried out at a temperature of 500° C. so that the aluminum-based thin layer 95 shows a reaction with the base layer 94 so that the aluminum-based thin layer 95 is re-flowed through the vertical walls toward the bottom of the contact hole 92.

With reference to FIG. 4C, after the heat treatment has been continued for 30 seconds, the re-flowing aluminum-based thin layer 95 reaches the bottom and deep portion of the contact hole 92.

With reference to FIG. 4D, a aluminum-based layer 96 is further deposited on the aluminum-based thin layer 95 by a sputtering method at a high temperature so that the contact hole 92 is completely filled by laminations of the aluminum-based thin layer 95 and the aluminum-based layer 96.

The above conventional methods of the chemical vapor deposition in combination with the high pressure re-flow process have the flowing disadvantages. A chemical vapor deposition is carried out under a vacuum whilst the high pressure re-flow process is carried out under a high pressure which is higher than the vacuum of the chemical vapor deposition by $1 \times 10^7$ times. A chemical vapor deposition system and a high pressure re-flow system are connected under an inert gas atmosphere or a vacuum. This connection mechanism enlarges the system. Further, it takes a long time to carry a wafer between the systems. Those result in a large increase in manufacturing cost of the semiconductor device.

In the meantime, the above other conventional method of the physical vapor deposition such as the sputtering method is combination with the re-flow process also has the above disadvantages as engaged with the conventional methods of the chemical vapor deposition. A sputtering process is carried out under a vacuum whilst the high pressure re-flow process is carried out under a high pressure which is largely different from each other. A sputtering system and a high pressure re-flow system are connected under an inert gas atmosphere or a vacuum. This connection mechanism enlarges the system. Further, it takes a long time to carry a wafer between the both systems. Those result in a large increase in manufacturing cost of the semiconductor device. The above other conventional method of the physical vapor deposition such as the sputtering method in combination with the re-flow process further has the following disadvantages. As a result of the reaction of the aluminum layer with the base layer, a highly resistive alloy layer is formed, for which reason a resistance of the interconnection is increased, whereby a high speed performance of the semiconductor device is deteriorated.

In the above circumstances, it had been required to develop a novel method of forming an aluminum interconnection layer extending not only over an inter-layer insulator but also within a contact hole, or a through hole or a via hole free from the above disadvantages.

SUMMARY OF THE INVENTION

Accordingly, it is an object of the present invention to provide a novel method of forming an aluminum interconnection layer extending not only over an inter-layer insulator but also within a contact hole, or a through hole or a via hole free from the above problems.

It is a further object of the present invention to provide a novel method of forming an aluminum interconnection layer extending not only over an inter-layer insulator but also within a contact hole, or a through hole or a via hole, wherein the hole has a aspect ratio of not less than 3.

It is a still further object of the present invention to provide a novel method of forming an aluminum interconnection layer extending not only over an inter-layer insulator but also within a contact hole, or a through hole or a via hole without forming any void.

It is yet a further object of the present invention to provide a novel method of forming an aluminum interconnection layer extending not only over an inter-layer insulator but also within a contact hole, or a through hole or a via hole at a relatively low temperature.

It is a further more object of the present invention to provide a novel method of forming an aluminum interconnection layer extending not only over an inter-layer insulator but also within a contact hole, or a through hole or a via hole by using not so large a system.

The first present invention provides a method of forming an aluminum-based layer mainly including aluminum on a surface of an insulating layer and within a hole formed in the insulating layer. The method comprises the steps of: carrying out a chemical vapor deposition to deposit the aluminum-based layer on the surface of the insulating layer and also to incompletely fill the hole by use of a source including at least one of alkyl groups and hydrogen so that a surface of the aluminum-based layer is terminated by the at least one of alkyl groups and hydrogen included in the source, and so that the surface of the aluminum-based layer is free of any natural oxide film; and carrying out a heat treatment, without formation of any natural oxide film on the surface of the aluminum-based layer, for causing a re-flow of the aluminum-based layer, whereby the at least one of alkyl groups and hydrogen promotes a migration of aluminum atoms on the surface of the aluminum-based layer.

The above and other objects, features and advantages of the present invention will be apparent form the following descriptions.

BRIEF DESCRIPTION OF THE DRAWINGS

Preferred embodiments according to the present invention will be described in detail with reference to the accompanying drawings.

DESCRIPTION OF THE PREFERRED EMBODIMENTS

Figure 1:
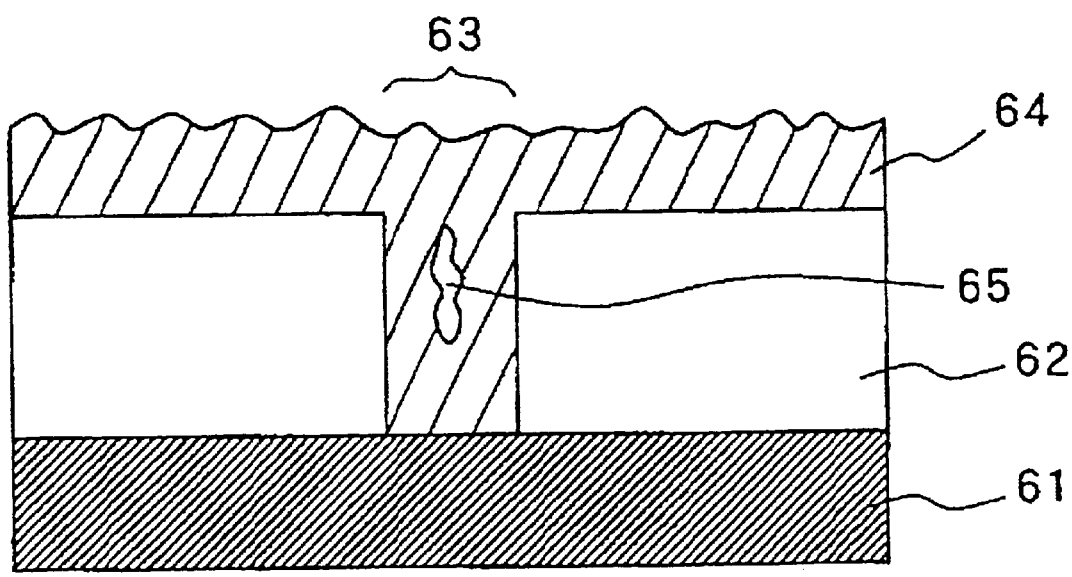
FIG. 1 is a fragmentary cross sectional elevation view illustrative of an aluminum layer formed by the conventional chemical vapor deposition, wherein the aluminum layer not only extends over an inter-layer insulator but also is filled within a contact hole and a void is formed in the aluminum layer within the contact hole.
Figure 2A:
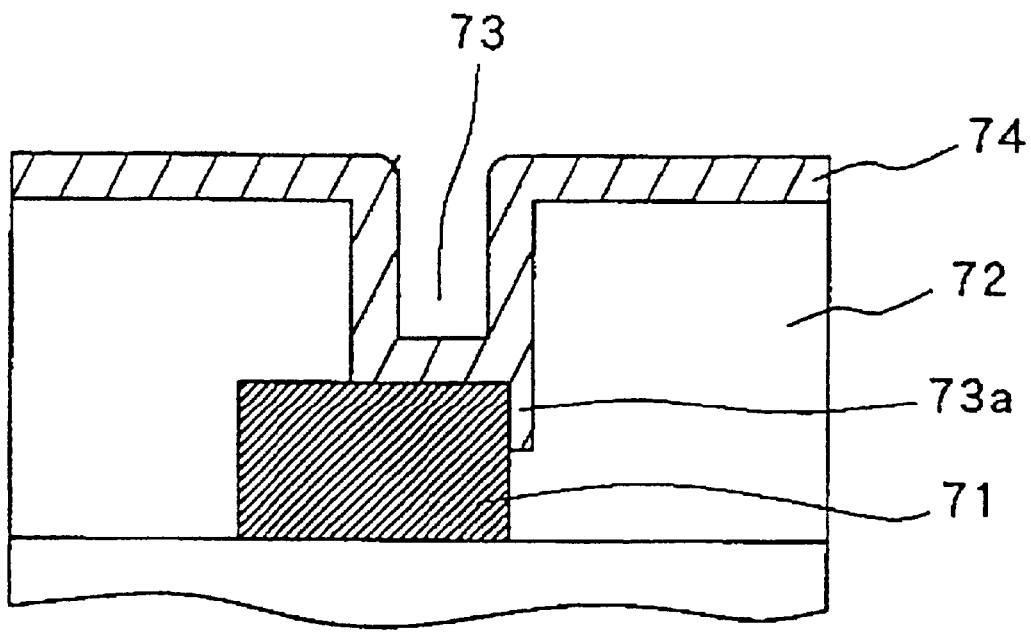
FIGS. 2A and 2B are fragmentary cross sectional elevation views illustrative of a second conventional method wherein chemical vapor deposition processes of aluminum are carried out two times to form an aluminum interconnection layer out only extending over an inter-layer insulator but also fills within a contact hole which is, however, displaced so that the contact hole is positioned over a step formed by an edge of a bottom level interconnection over a substrate.
Figure 2B:
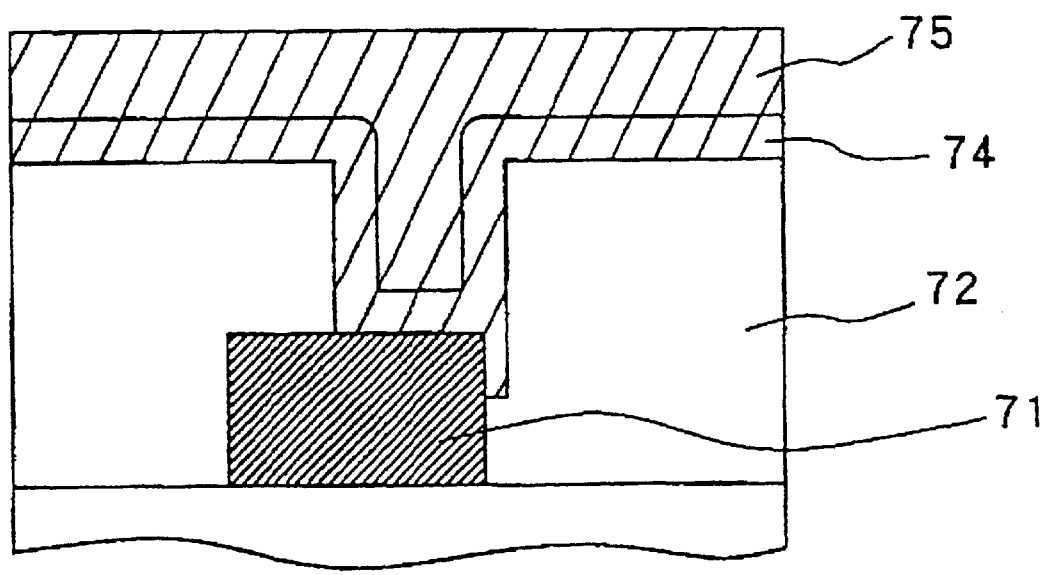
Figure 3A:
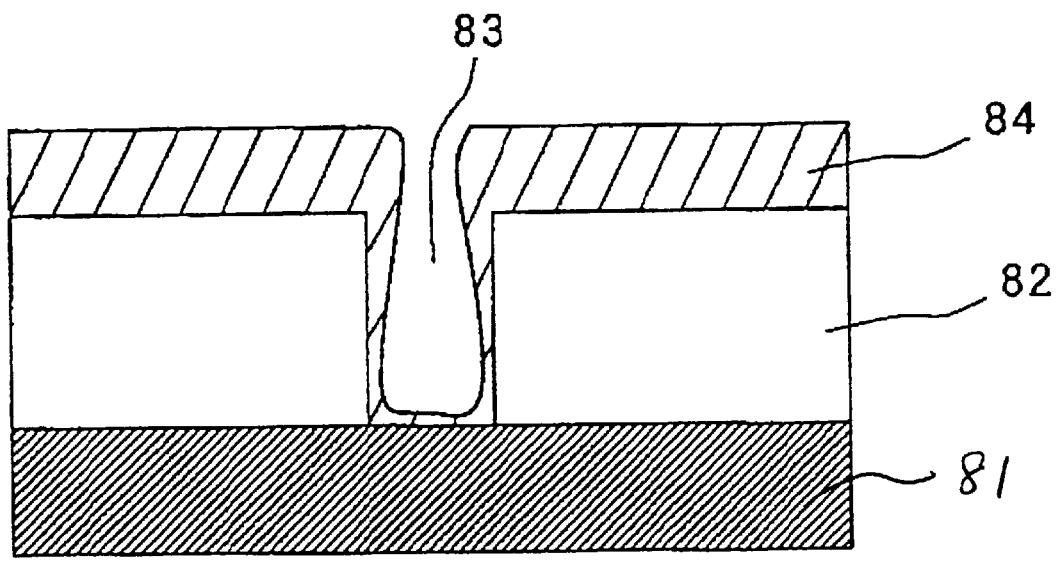
FIGS. 3A and 3B are fragmentary cross sectional elevation views illustrative of a first conventional sputtering method for forming an aluminum interconnection layer not only extending over an inter-layer insulator but also fills within a through hole formed in the inter-layer insulator.
Figure 3B:
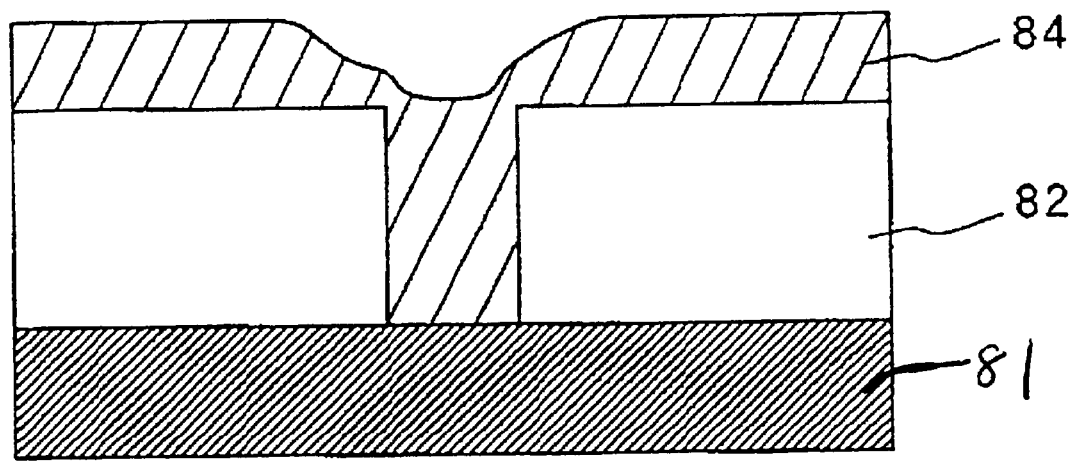
Figure 4A:
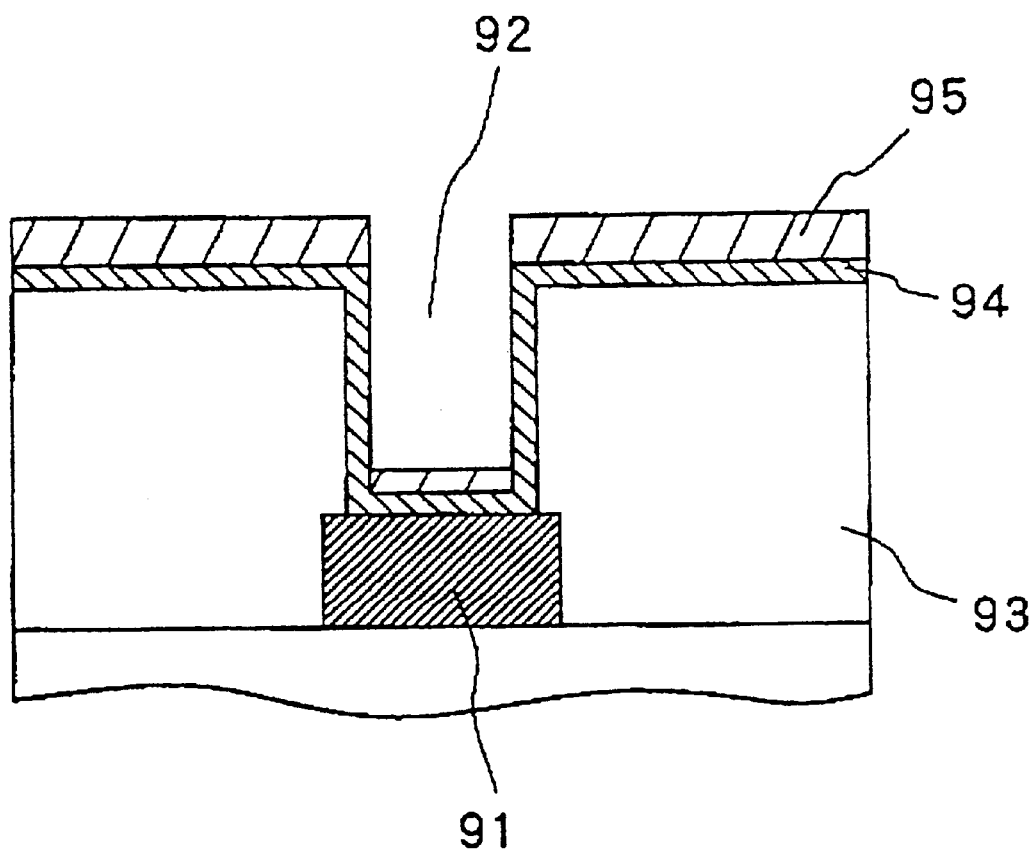
FIGS. 4A through 4D are fragmentary cross sectional elevation views illustrative of a second conventional sputtering method for forming an aluminum interconnection not only extending over an inter-layer insulator but also fills a contact hole formed in the inter-layer insulator.
Figure 4B:
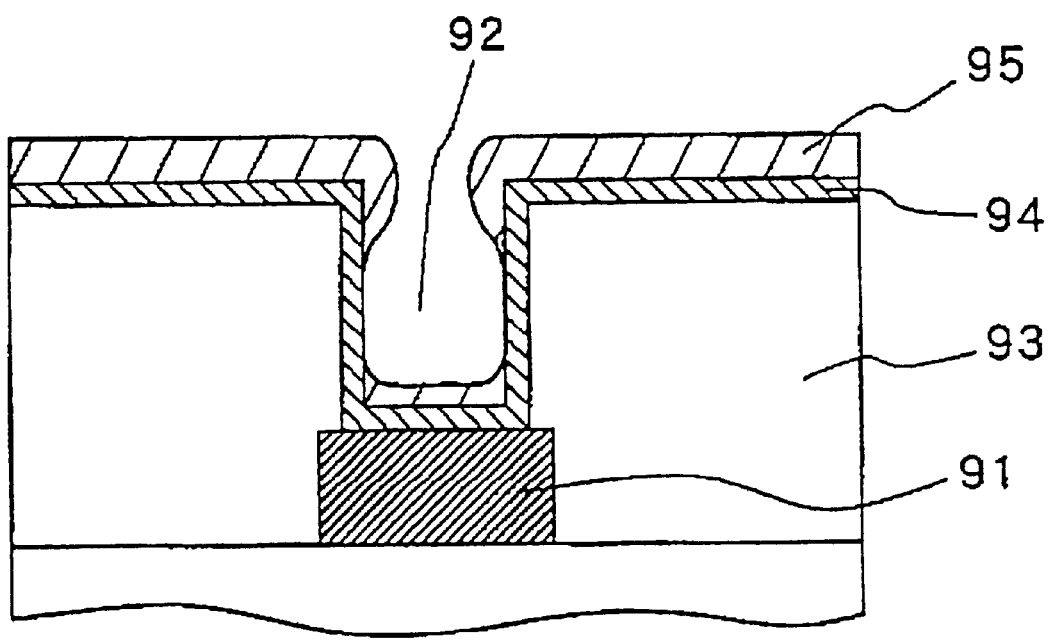
Figure 4C:
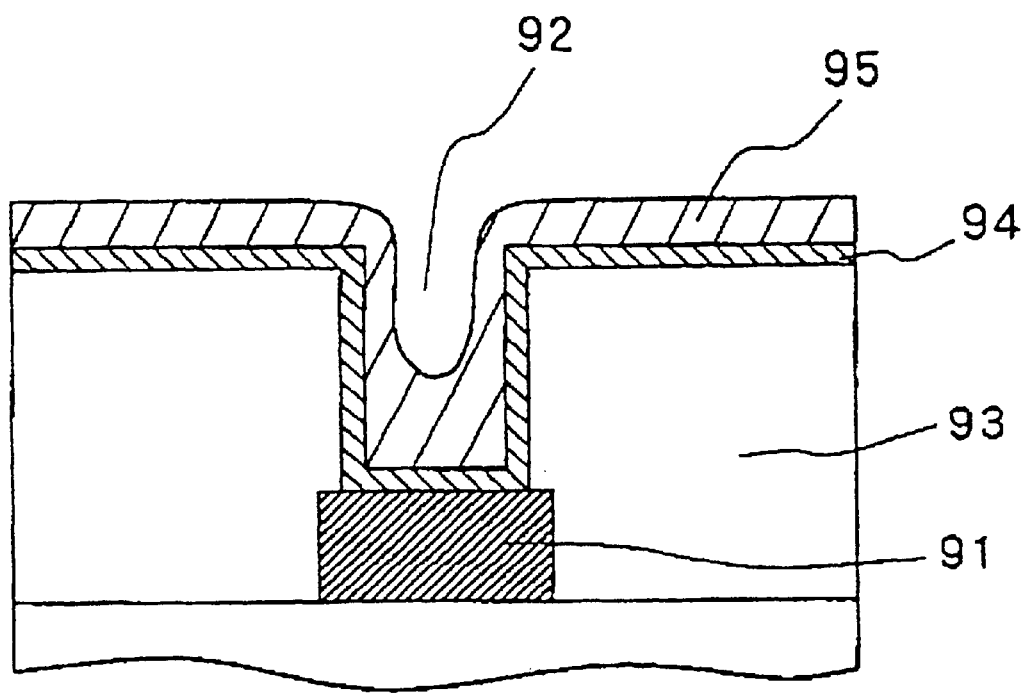
Figure 4D:
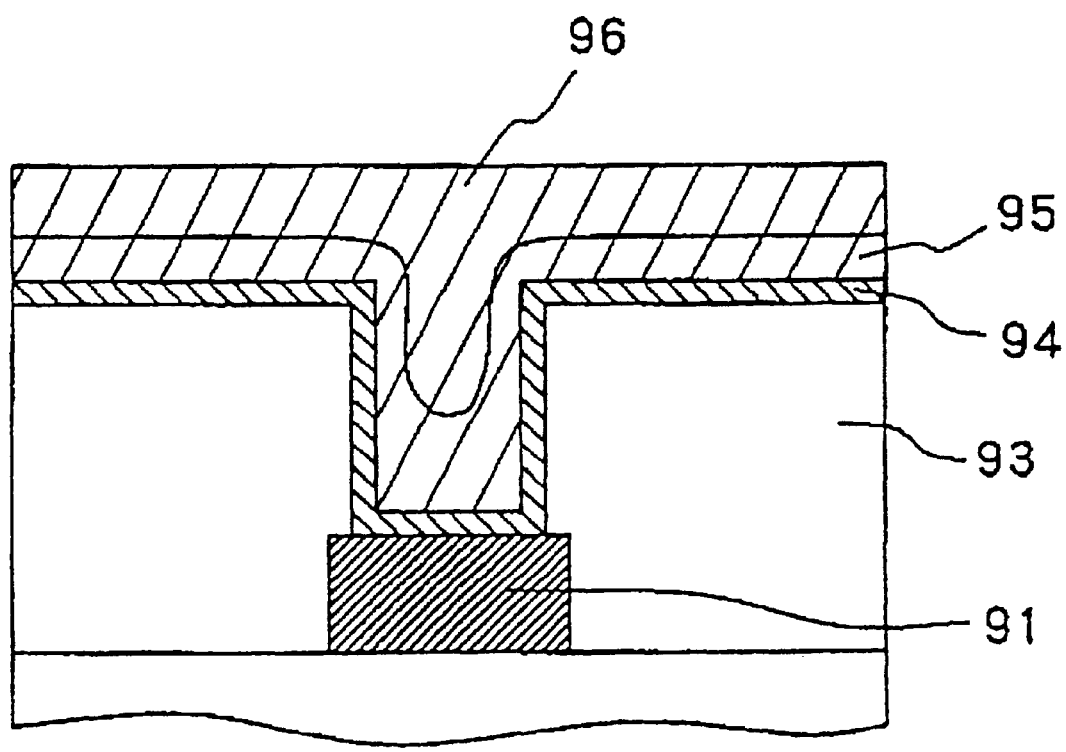

The first aspect of the present invention provides a method of forming an aluminum-based layer mainly including aluminum on a surface of an insulating layer and within a hole formed in the insulating layer. The method comprises the steps of: carrying out a chemical vapor deposition to deposit the aluminum-based layer on the surface of the insulating layer and also to incompletely fill the hole by use of a source including at least one of alkyl groups and hydrogen so that a surface of the aluminum-based layer is terminated by the at least one of alkyl groups and hydrogen included in the source, and so that the surface of the aluminum-based layer is free of any natural oxide film; and carrying out a heat treatment, without formation of any natural oxide film on the surface of the aluminum-based layer, for causing a re-flow of the aluminum-based layer, whereby the at least one of alkyl groups and hydrogen promotes a migration of aluminum atoms on the surface of the aluminum-based layer.

It is preferable that, following to the chemical vapor deposition, the heat treatment is carried out under a partial pressure of not higher than $1 \times 10^{-7}$ Torr of a gas capable of oxidation to the aluminum-based layer.

It is also preferable that the partial pressure of the gas capable of oxidation to the aluminum-based layer is not higher than $1 \times 10^{-8}$ Torr.

It is also preferable that, following to the chemical vapor deposition, the heat treatment is carried out in a vacuum.

It is also preferable that the heat treatment is carried out in a vacuum chamber used for the chemical vapor deposition.

It is also preferable that, following to the chemical vapor deposition, the heat treatment is carried out at a temperature in a range of 250–600° C.

It is also preferable that the temperature of the heat treatment is in a range of 270–500° C.

It is also preferable that the temperature of the heat treatment is in a range of 330–450° C.

It is also preferable that the aluminum-based layer is deposited to incompletely fill the hole at not less than 75% by volume of the hole.

It is also preferable that the aluminum-based layer is deposited to have a thickness which is less than a half of a minimum horizontal size of the hole.

It is also preferable to further comprise a step of forming, prior to the chemical vapor deposition, a thin base layer on the surface of the insulating layer and on vertical walls of the hole as well as on a bottom of the hole, wherein the thin base layer is made of a material which is capable of serving as a seed for subsequently carrying out the chemical vapor deposition to deposit the aluminum-based layer on the thin base layer.

It is also preferable that the thin base layer is made of a material selected from a group consisting of titanium, titanium nitride, silicon, titanium tetrachloride, terra-quisdimethyl-amino-titanium, titanium silicide, tungsten silicide, vanadium, hafnium, niobium, tantrum and platinum.

It is also preferable to further comprise a step of carrying out, following to the chemical vapor deposition, a physical deposition of a secondary aluminum-based layer on the aluminum-based layer deposited by the chemical vapor deposition.

It is also preferable that the physical deposition is made by a sputtering process by use of an aluminum target to deposit the secondary aluminum-based layer which comprises an aluminum layer.

It is also preferable that the physical deposition is made by a sputtering process by use of a copper-containing aluminum target to deposit the secondary aluminum-based layer which comprises a copper containing aluminum layer.

It is also preferable that a concentration of copper in the copper containing aluminum layer is about 1% by weight.

It is also preferable that the sputtering process is carried out at a sufficiently high temperature for causing a diffusion of copper atoms from the secondary aluminum-based layer into the aluminum-based layer deposited by the chemical vapor deposition.

It is also preferable to further comprise a step of carrying out a secondary heat treatment, after the sputtering process, to cause a diffusion of copper atoms from the secondary aluminum-based layer into the aluminum-based layer deposited by the chemical vapor deposition.

It is also preferable to further comprise a step of carrying out, after the physical deposition, a chemical mechanical polishing to laminations of the aluminum-based layer deposited by the chemical vapor deposition and the secondary aluminum-based layer deposited by the physical deposition so that the laminations remain only within the hole.

It is also preferable to further comprise a step of carrying out, after the heat treatment, a chemical mechanical polishing to the aluminum-based layer so as to remain only within the hole.

The second aspect of the present invention provides a method of forming an aluminum-based layer mainly including aluminum on a surface of an insulating layer and within a groove formed in the insulating layer. The method comprises the steps of: carrying out a chemical vapor deposition to deposit the aluminum-based layer on the surface of the insulating layer and also to incompletely fill the groove by use of a source including at least one of alkyl groups and hydrogen so that a surface of the aluminum-based layer is terminated by the at least one of alkyl groups and hydrogen included in the source, and so that the surface of the aluminum-based layer is free of any natural oxide film; and carrying out a heat treatment, without formation of any natural oxide film on the surface of the aluminum-based layer, for causing a re-flow of the aluminum-based layer, whereby the at least one of alkyl groups and hydrogen promotes a migration of aluminum atoms on the surface of the aluminum-based layer.

It is preferable that, following to the chemical vapor deposition, the heat treatment is carried out under a partial pressure of not higher than $1\times10^{-7}$ Torr of a gas capable of oxidation to the aluminum-based layer.

It is also preferable that the partial pressure of the gas capable of oxidation to the aluminum-based layer is not higher than $1\times10^{-8}$ Torr.

It is also preferable that the heat treatment is carried out in a vacuum chamber used for the chemical vapor deposition.

It is also preferable that, following to the chemical vapor deposition, the heat treatment is carried out at a temperature in a range of 250–600° C.

It is also preferable that the temperature of the heat treatment is in a range of 270–500° C.

It is also preferable that the temperature of the heat treatment is in a range of 330–450° C.

It is also preferable that the aluminum-based layer is deposited to incompletely fill the groove at not less than 75% by volume of the groove.

It is also preferable that the aluminum-based layer is deposited to have a thickness which is less than a half of a minimum horizontal size of the groove.

It is also preferable to further comprise a step of forming, prior to the chemical vapor deposition, a thin base layer on the surface of the insulating layer and on vertical walls of the groove as well as on a bottom of the groove, wherein the thin base layer is made of a material which is capable of serving as a seed for subsequently carrying out the chemical vapor deposition to deposit the aluminum-based layer on the thin base layer.

It is also preferable that the thin base layer is made of a material selected from a group consisting of titanium, titanium nitride, silicon, titanium tetrachloride, terra-quis-dimethyl-amino-titanium, titanium silicide, tungsten silicide, vanadium, hafnium, niobium, tantrum and platinum.

It is also preferable to further comprise a step of carrying out, following to the chemical vapor deposition, a physical deposition of a secondary aluminum-based layer on the aluminum-based layer deposited by the chemical vapor deposition.

It is also preferable that the physical deposition is made by a sputtering process by use of an aluminum target to deposit the secondary aluminum-based layer which comprises an aluminum layer.

It is also preferable that the physical deposition is made by a sputtering process by use of a copper-containing aluminum target to deposit the secondary aluminum-based layer which comprises a copper containing aluminum layer.

It is also preferable that a concentration of copper in the copper containing aluminum layer is about 1% by weight.

It is also preferable that the sputtering process is carried out at a sufficiently high temperature for causing a diffusion of copper atoms from the secondary aluminum-based layer into the aluminum-based layer deposited by the chemical vapor deposition.

It is also preferable to further comprise a step of carrying out a secondary heat treatment, after the sputtering process, to cause a diffusion of copper atoms from the secondary aluminum-based layer into the aluminum-based layer deposited by the chemical vapor deposition.

It is also preferable to further comprise a step of carrying out, after the physical deposition, a chemical mechanical polishing to laminations of the aluminum-based layer deposited by the chemical vapor deposition and the secondary aluminum-based layer deposited by the physical deposition so that the laminations remain only within the groove.

It is also preferable to further comprise a step of carrying out, after the heat treatment, a chemical mechanical polishing to the aluminum-based layer so as to remain only within the groove.

The third aspect of the present invention provides a method of forming an aluminum-based layer mainly including aluminum on a surface of an insulating layer and within a depressed portion formed in the insulating layer. The method comprises the steps of: carrying out a chemical vapor deposition to deposit the aluminum-based layer on the surface of the insulating layer and also to incompletely fill the depressed portion by use of a source including at least one of alkyl groups and hydrogen so that a surface of the aluminum-based layer is terminated by the at least one of alkyl groups and hydrogen included in the source, and so that the surface of the aluminum-based layer is free of any natural oxide film; and carrying out a heat treatment, without formation of any natural oxide film on the surface of the aluminum-based layer, for causing a re-flow of the aluminum-based layer, whereby the at least one of alkyl groups and hydrogen promotes a migration of aluminum atoms on the surface of the aluminum-based layer.

It is preferable that, following to the chemical vapor deposition, the heat treatment is carried out under a partial pressure of not higher than $1\times10^{-7}$ Torr of a gas capable of oxidation to the aluminum-based layer.

It is also preferable that the partial pressure of the gas capable of oxidation to the aluminum-based layer is not higher than $1\times10^{-8}$ Torr.

It is also preferable that, following to the chemical vapor deposition, the heat treatment is carried out in a vacuum.

It is also preferable that the heat treatment is carried out in a vacuum chamber used for the chemical vapor deposition.

It is also preferable that, following to the chemical vapor deposition, the heat treatment is carried out at a temperature in a range of 250–600° C.

It is also preferable that the temperature of the heat treatment is in a range of 270–500° C.

It is also preferable that the temperature of the heat treatment is in a range of 330–450° C.

It is also preferable that the aluminum-based layer is deposited to incompletely fill the depressed portion at not less than 75% by volume of the depressed portion.

It is also preferable that the aluminum-based layer is deposited to have a thickness which is less than a half of a minimum horizontal size of the depressed portion.

It is also preferable to further comprise a step of forming, prior to the chemical vapor deposition, a thin base layer on the surface of the insulating layer and on vertical walls of the depressed portion as well as on a bottom of the depressed portion, wherein the thin base layer is made of a material which is capable of serving as a seed for subsequently carrying out the chemical vapor deposition to deposit the aluminum-based layer on the thin base layer.

It is also preferable that the thin base layer is made of a material selected from a group consisting of titanium, titanium nitride, silicon, titanium tetrachloride, terra-quis-dimethyl-amino-titanium, titanium silicide, tungsten silicide, vanadium, hafnium, niobium, tantrum and platinum.

It is also preferable to further comprise a step of carrying out, following to the chemical vapor deposition, a physical deposition of a secondary aluminum-based layer on the aluminum-based layer deposited by the chemical vapor deposition.

It is also preferable that the physical deposition is made by a sputtering process by use of an aluminum target to deposit the secondary aluminum-based layer which comprises an aluminum layer.

It is also preferable that the physical deposition is made by a sputtering process by use of a copper-containing aluminum target to deposit the secondary aluminum-based layer which comprises a copper containing aluminum layer.

It is also preferable that a concentration of copper in the copper containing aluminum layer is about 1% by weight.

It is also preferable that the sputtering process is carried out at a sufficiently high temperature for causing a diffusion of copper atoms from the secondary aluminum-based layer into the aluminum-based layer deposited by the chemical vapor deposition.

It is also preferable to further comprise a step of carrying out a secondary heat treatment, after the sputtering process, to cause a diffusion of copper atoms from the secondary aluminum-based layer into the aluminum-based layer deposited by the chemical vapor deposition.

It is also preferable to further comprise a step of carrying out, after the physical deposition, a chemical mechanical polishing to laminations of the aluminum-based layer deposited by the chemical vapor deposition and the secondary aluminum-based layer deposited by the physical deposition so that the laminations remain only within the depressed portion.

It is also preferable to further comprise a step of carrying out, after the heat treatment, a chemical mechanical polishing to the aluminum-based layer so as to remain only within the depressed portion.

The fourth aspect of the present invention provides a method of forming an aluminum-based layer mainly including aluminum on a surface of an insulating layer over a substrate and within a hole formed in the insulating layer. The method comprises the steps of: carrying out a chemical vapor deposition to deposit the aluminum-based layer on the surface of the insulating layer and also to incompletely fill the hole by use of a source including at least one of alkyl groups and hydrogen so that a surface of the aluminum-based layer is terminated by the at least one of alkyl groups and hydrogen included in the source, and so that the surface of the aluminum-based layer is free of any natural oxide film; and maintain the substrate, without formation of any natural oxide film on the surface of the aluminum-based layer, at a sufficiently high substrate temperature for causing a re-flow of the aluminum-based layer, whereby the at least one of alkyl groups and hydrogen promotes a migration of aluminum atoms on the surface of the aluminum-based layer.

It is preferable that, following to the chemical vapor deposition, the substrate is maintained under a partial pressure of not higher than $1\times10^{-7}$ Torr of a gas capable of oxidation to the aluminum-based layer.

It is also preferable that the partial pressure of the gas capable of oxidation to the aluminum-based layer is not higher than $1\times10^{-8}$ Torr.

It is also preferable that, following to the chemical vapor deposition, the heat treatment is carried out in a vacuum.

It is also preferable that the substrate is maintained in a vacuum chamber used for the chemical vapor deposition.

It is also preferable that, following to the chemical vapor deposition, the substrate temperature is in a range of 250–600° C.

It is also preferable that the substrate temperature is in a range of 270–500° C.

It is also preferable that the substrate temperature is in a range of 330–450° C.

It is also preferable that the aluminum-based layer is deposited to incompletely fill the hole at not less than 75% by volume of the hole.

It is also preferable that the aluminum-based layer is deposited to have a thickness which is less than a half of a minimum horizontal size of the hole.

It is also preferable to further comprise a step of forming, prior to the chemical vapor deposition, a thin base layer on the surface of the insulating layer and on vertical walls of the hole as well as on a bottom of the hole, wherein the thin base layer is made of a material which is capable of serving as a seed for subsequently carrying out the chemical vapor deposition to deposit the aluminum-based layer on the thin base layer.

It is also preferable that the thin base layer is made of a material selected from a group consisting of titanium, titanium nitride, silicon, titanium tetrachloride, terra-quis-dimethyl-amino-titanium, titanium silicide, tungsten silicide, vanadium, hafnium, niobium, tantrum and platinum.

It is also preferable to further comprise a step of carrying out, following to the chemical vapor deposition, a physical deposition of a secondary aluminum-based layer on the aluminum-based layer deposited by the chemical vapor deposition.

It is also preferable that the physical deposition is made by a sputtering process by use of an aluminum target to deposit the secondary aluminum-based layer which comprises an aluminum layer.

It is also preferable that the physical deposition is made by a sputtering process by use of a copper-containing aluminum target to deposit the secondary aluminum-based layer which comprises a copper containing aluminum layer.

It is also preferable that a concentration of copper in the copper containing aluminum layer is about 1% by weight.

It is also preferable that the sputtering process is carried out at a sufficiently high temperature for causing a diffusion of copper atoms from the secondary aluminum-based layer into the aluminum-based layer deposited by the chemical vapor deposition.

It is also preferable to further comprise a step of carrying out a secondary heat treatment, after the sputtering process, to cause a diffusion of copper atoms from the secondary aluminum-based layer into the aluminum-based layer deposited by the chemical vapor deposition.

It is also preferable to further comprise a step of carrying out, after the physical deposition, a chemical mechanical polishing to laminations of the aluminum-based layer deposited by the chemical vapor deposition and the secondary aluminum-based layer deposited by the physical deposition so that the laminations remain only within the hole.

It is also preferable to further comprise a step of carrying out, after the heat treatment, a chemical mechanical polishing to the aluminum-based layer so as to remain only within the hole.

The fifth present aspect of the invention provides a method of forming an aluminum-based layer mainly including aluminum on a surface of an insulating layer over a substrate and within a groove formed in the insulating layer. The method comprises the steps of: carrying out a chemical vapor deposition to deposit the aluminum-based layer on the surface of the insulating layer and also to incompletely fill the groove by use of a source including at least one of alkyl groups and hydrogen so that a surface of the aluminum-based layer is terminated by the at least one of alkyl groups and hydrogen included in the source, and so that the surface of the aluminum-based layer is free of any natural oxide film; and maintain the substrate, without formation of any natural oxide film on the surface of the aluminum-based layer, at a sufficiently high substrate temperature for causing a re-flow of the aluminum-based layer, whereby the at least one of alkyl groups and hydrogen promotes a migration of aluminum atoms on the surface of the aluminum-based layer.

It is preferable that, following to the chemical vapor deposition, the substrate is maintained under a partial pressure of not higher than $1 \times 10^{-7}$ Torr of a gas capable of oxidation to the aluminum-based layer.

It is also preferable that the partial pressure of the gas capable of oxidation to the aluminum-based layer is not higher than $1 \times 10^{-8}$ Torr.

It is also preferable that, following to the chemical vapor deposition, the heat treatment is carried out in a vacuum.

It is also preferable that the substrate is maintained in a vacuum chamber used for the chemical vapor deposition.

It is also preferable that the substrate is maintained in a vacuum chamber used for the chemical vapor deposition.

It is also preferable that, following to the chemical vapor deposition, the substrate temperature is in a range of 250–600° C.

It is also preferable that the substrate temperature is in a range of 270–500° C.

It is also preferable that the substrate temperature is in a range of 330–450° C.

It is also preferable that the aluminum-based layer is deposited to incompletely fill the groove at not less than 75% by volume of the groove.

It is also preferable that the aluminum-based layer is deposited to have a thickness which is less than a half of a minimum horizontal size of the groove.

It is also preferable to further comprise a step of forming, prior to the chemical vapor deposition, a thin base layer on the surface of the insulating layer and on vertical walls of the groove as well as on a bottom of the groove, wherein the thin base layer is made of a material which is capable of serving as a seed for subsequently carrying out the chemical vapor deposition to deposit the aluminum-based layer on the thin base layer.

It is also preferable that the thin base layer is made of a material selected form a group consisting of titanium, titanium nitride, silicon, titanium tetrachloride, terra-quis-dimethyl-amino-titanium, titanium silicide, tungsten silicide, vanadium, hafnium, niobium, tantrum and platinum.

It is also preferable to further comprise a step of carrying out, following to the chemical vapor deposition, a physical deposition of a secondary aluminum-based layer on the aluminum-based layer deposited by the chemical vapor deposition.

It is also preferable that the physical deposition is made by a sputtering process by use of an aluminum target to deposit the secondary aluminum-based layer which comprises an aluminum layer.

It is also preferable that the physical deposition is made by a sputtering process by use of a copper-containing aluminum target to deposit the secondary aluminum-based layer which comprises a copper containing aluminum layer.

It is also preferable that a concentration of copper in the copper containing aluminum layer is about 1% by weight.

It is also preferable that the sputtering process is carried out at a sufficiently high temperature for causing a diffusion of copper atoms from the secondary aluminum-based layer into the aluminum-based layer deposited by the chemical vapor deposition.

It is also preferable to further comprise a step of carrying out a secondary heat treatment, after the sputtering process, to cause a diffusion of copper atoms from the secondary aluminum-based layer into the aluminum-based layer deposited by the chemical vapor deposition.

It is also preferable to further comprise a step of carrying out, after the physical deposition, a chemical mechanical polishing to laminations of the aluminum-based layer deposited by the chemical vapor deposition and the secondary aluminum-based layer deposited by the physical deposition so that the laminations remain only within the groove.

It is also preferable to further comprise a step of carrying out, after the heat treatment, a chemical mechanical polishing to the aluminum-based layer so as to remain only within the groove.

The sixth aspect of the present invention provides a method of forming an aluminum-based layer mainly including aluminum on a surface of an insulating layer over a substrate and within a depressed portion formed in the insulating layer. The method comprising the steps of: carrying out a chemical vapor deposition to deposit the aluminum-based layer on the surface of the insulating layer and also to incompletely fill the depressed portion by use of a source including at least one of alkyl groups and hydrogen so that a surface of the aluminum-based layer is terminated by the at least one of alkyl groups and hydrogen included in the source, and so that the surface of the aluminum-based layer is free of any natural oxide film; and maintain the substrate, without formation of any natural oxide film on the surface of the aluminum-based layer, at a sufficiently high substrate temperature for causing a re-flow of the aluminum-based layer, whereby the at least one of alkyl groups and hydrogen promotes a migration of aluminum atoms on the surface of the aluminum-based layer.

It is preferable that, following to the chemical vapor deposition, the substrate is maintained under a partial pressure of not higher than $1 \times 10^{-7}$ Torr of a gas capable of oxidation to the aluminum-based layer.

It is also preferable that the partial pressure of the gas capable of oxidation to the aluminum-based layer is not higher than $1 \times 10^{-8}$ Torr.

It is also preferable that, following to the chemical vapor deposition, the heat treatment is carried out in a vacuum.

It is also preferable that the substrate is maintained in a vacuum chamber used for the chemical vapor deposition.

It is also preferable that, following to the chemical vapor deposition, the substrate temperature is in a range of 250–600° C.

It is also preferable that the substrate temperature is in a range of 270–500° C.

It is also preferable that the substrate temperature is in a range of 330–450° C.

It is also preferable that the aluminum-based layer is deposited to incompletely fill the depressed portion at not less than 75% by volume of the depressed portion.

It is also preferable that the aluminum-based layer is deposited to have a thickness which is less than a half of a minimum horizontal size of the depressed portion.

It is also preferable to further comprise a step of forming, prior to the chemical vapor deposition, a thin base layer on the surface of the insulating layer and on vertical walls of the depressed portion as well as on a bottom of the depressed portion, wherein the thin base layer is made of a material which is capable of serving as a seed for subsequently carrying out the chemical vapor deposition to deposit the aluminum-based layer on the thin base layer.

It is also preferable that the thin base layer is made of a material selected from a group consisting of titanium, titanium nitride, silicon, titanium tetrachloride, terra-quis-dimethyl-amino-titanium, titanium silicide, tungsten silicide, vanadium, hafnium, niobium, tantrum and platinum.

It is also preferable to further comprise a step of carrying out, following to the chemical vapor deposition, a physical deposition of a secondary aluminum-based layer on the aluminum-based layer deposited by the chemical vapor deposition.

It is also preferable that the physical deposition is made by a sputtering process by use of an aluminum target to deposit the secondary aluminum-based layer which comprises an aluminum layer.

It is also preferable that the physical deposition is made by a sputtering process by use of a copper-containing aluminum target to deposit the secondary aluminum-based layer which comprises a copper containing aluminum layer.

It is also preferable that a concentration of copper in the copper containing aluminum layer is about 1% by weight.

It is also preferable that the sputtering process is carried out at a sufficiently high temperature for causing a diffusion of copper atoms from the secondary aluminum-based layer into the aluminum-based layer deposited by the chemical vapor deposition.

It is also preferable to further comprise a step of carrying out a secondary heat treatment, after the sputtering process, to cause a diffusion of copper atoms from the secondary aluminum-based layer into the aluminum-based layer deposited by the chemical vapor deposition.

It is also preferable to further comprise a step of carrying out, after the physical deposition, a chemical mechanical polishing to laminations of the aluminum-based layer deposited by the chemical vapor deposition and the secondary aluminum-based layer deposited by the physical deposition so that the laminations remain only within the depressed portion.

It is also preferable to further comprise a step of carrying out, after the heat treatment, a chemical mechanical polishing to the aluminum-based layer so as to remain only within the depressed portion.

In accordance with the present invention, an aluminum-based layer is deposited on a non-flat surface of an insulating layer before a heat treatment is carried out prior to a natural oxide film is formed on a surface of the aluminum-based layer. It is particularly preferable to a deposition seed layer for subsequent chemical vapor deposition to deposit the aluminum-based layer on the deposition seed layer.

The above non-flat surface of the insulating layer includes an insulating layer having a contact hole, a through hole, a via hole, a groove such as a trench groove for interconnection. The insulating layer may of course comprise an interlayer insulator. Available insulating layers are, for example, an organic spin-on-glass film, an inorganic spin-on-glass film, a parylene film, a cytop film, a polyquinoline film, a benzocyclobutene film, a polyimide film, and a HSQ film.

It is particularly preferable to a deposition seed layer on the above non-flat surface of the insulating layer for subsequent chemical vapor deposition to deposit the aluminum-based layer on the deposition seed layer. Available or preferable deposition seed layers are, for example, a titanium layer, a titanium nitride layer, a silicon layer, a titanium tetrachloride adsorption layer, a terra-quis-dimethyl-amino-titanium adsorption layer, a titanium silicide layer, a tungsten silicide layer, a vanadium layer, a hafnium layer, a niobium layer, a tantrum layer and a platinum layer.

After the deposition seed layer has been formed, a chemical vapor deposition of aluminum layer is carried out by use of a source gas of alkyl aluminum such as dimethylalkyl-aluminumhydride, or tri-isobutyl-aluminum $[(CH_3)_2CHCH_2]_3Al$ or aluminum-hydride-amine-adducts $(CH_3)_3NAlH_3$, $(CH_3)_3NAlH_3N(CH_3)_3$, and $(CH_3)_2(C_2H_5)NAlH_3$. The aluminum layer has a thickness of smaller than a minimum radius of the hole, so that hole is incompletely filled with the aluminum layer. If the aluminum layer is deposited over the insulating layer having the groove, then the thickness of the aluminum layer is smaller than a half of the minimum width of the groove so that the groove is incompletely filled with the aluminum layer. The thin aluminum layer is conformally deposited on the entire surface by the chemical vapor deposition so that the hole or groove is incompletely filled with the thin aluminum layer, whereby not less than 75% by volume of the hole or groove is filled, for subsequent re-flow process to completely fill the hole or groove with the re-flowed aluminum layer.

After the aluminum-based layer has been deposited to fill not less than 75% by volume of the hole or groove, a heat treatment is carried out at a temperature in the range of 300–400° C. for such a short time under a controlled atmosphere as to prevent formation of a natural oxide film over the aluminum-based layer, so that the aluminum-based layer is re-flowed to completely fill the hole or groove without any reaction of the aluminum-based layer with the deposition seed base layer. As a result, no highly resistive alloy layer is thus formed. The heat treatment is carried out at a temperature in the range of 250–600° C. A preferable temperature is in the range of 270–500° C. A further preferable temperature is in the range of 330–450° C. If the heat treatment were carried out at a temperature lower than 250° C., then the aluminum-based layer may show no re-flow. If the temperature of the heat treatment is not less than 270° C., then a slow reflow of the aluminum-based layer appears so that not less than 75% by volume of the hole or groove is filled with the re-flowed aluminum-based layer. If the temperature of the heat treatment is not less than 300° C., then a reflow of the aluminum-based layer appears so that not less than 80% by volume of the hole or groove is filled with the re-flowed aluminum-based layer. If the temperature of the heat treatment were not less than 600° C., then such the temperature is close to or beyond the melting point of the aluminum-based layer whereby a flatness of the re-flowed aluminum-based layer is deteriorated and also the aluminum-based layer may include crystal grins which deteriorates the shape of the interconnection. For those reasons, the high temperature heat treatment over 600° C. is not suitable for the base or bottom level interconnection.

The reason why the re-flowed aluminum-based layer can fill the hole or groove is as follows. First, prior to the re-flow process, not less than 75% by volume of the hole or groove has already been filled with the deposited aluminum-based layer, for which reason a small amount of the aluminum-based material is required to be re-flowed. Second, aluminum atoms are not present on a surface of the aluminum-based layer deposited by the chemical vapor deposition. The surface of the deposited aluminum-based layer is terminated with alkyl group or hydrogen included in the source of the chemical vapor deposition. For this reason, when the aluminum atoms show migration on the surface of the deposited aluminum-based layer, a distance of the migration is remarkably increased by the alkyl group or hydrogen included in the source of the chemical vapor deposition. For the above reasons, it is possible to cause a re-flow of the deposited aluminum-based layer even at a relatively low temperature to form a void free aluminum layer within the hole or groove.

It is important for causing a long distance aluminum atom migration that the surface of the deposited aluminum-based layer is terminated by the alkyl group or hydrogen included in the source of the chemical vapor deposition. If contrary to the present invention, a natural oxide film is formed on the surface of the deposited aluminum-based layer, then the natural oxide film prevents the aluminum atom migration whereby the deposited aluminum-based layer show no required re-flow. In order to prevent the formation of the natural oxide film on the surface of the deposited aluminum-based layer, it is required to carry out the heat treatment for the re-flow of the deposited aluminum-based layer as soon as the chemical vapor deposition process has been finished and also required to sufficiently reduce partial pressures of oxygen and water in the atmosphere. For example, it is preferable to reduce the partial pressure of oxygen to $1\times10^{-7}$ Torr, more preferably to $1\times10^{-8}$ Torr for the heat treatment. It is also possible to carry out the heat treatment under a vacuum for example, within the same vacuum chamber as used for the chemical vapor deposition process.

It is of course possible optically to carry out a sputtering process for depositing a secondary aluminum layer or aluminum alloy layer on the above re-flowed aluminum-based layer to increase a thickness of the interconnection layer.

It is also preferable that the physically deposited aluminum-based layer includes small amount of copper, for example, about 1% by weight of copper, whereby copper atoms are diffused into the aluminum layer deposited by the chemical vapor deposition process. The aluminum-based layer is highly stable to the electro-migration.

The above present invention is also applicable to an aluminum layer for a damascene interconnection by use of a chemical mechanical polishing process.

A first embodiment according to the present invention will be described in detail with reference to FIGS. 5A through 5C which are fragmentary cross sectional elevation views illustrative of a first novel method of forming an aluminum interconnection layer not only extending over an inter-layer insulator but also filling a contact hole formed in the inter-layer insulator to form a void free aluminum contact in a first embodiment in accordance with the present invention.

Figure 5A:
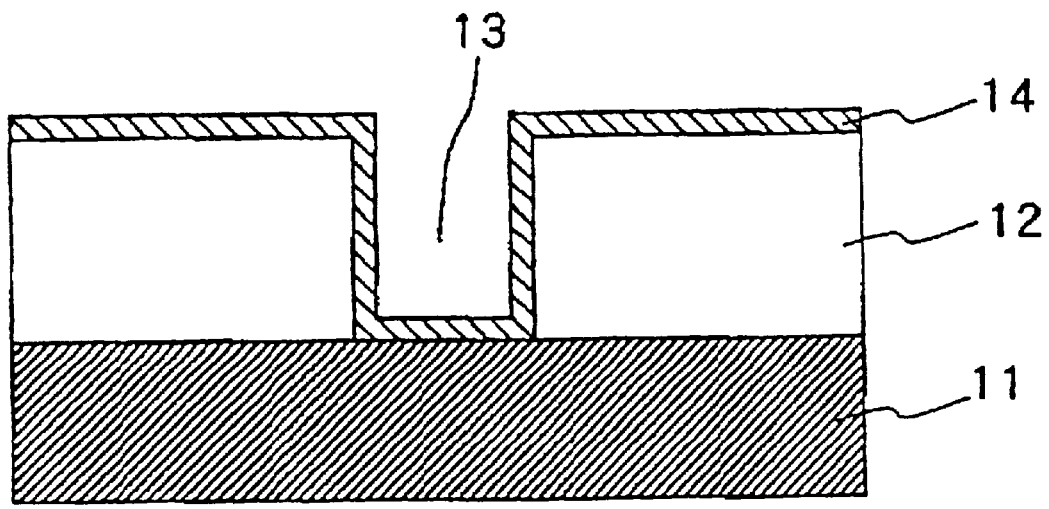
FIGS. 5A through 5C are fragmentary cross sectional elevation views illustrative of a first novel method of forming an aluminum interconnection layer not only extending over an inter-layer insulator but also filling a contact hole formed in the inter-layer insulator to form a void free aluminum contact in a first embodiment in accordance with the present invention.

With reference to FIG. 5A, an insulating layer 12 made of an insulating material such as silicon dioxide is formed on a silicon substrate 11. A contact hole 13 is formed in the insulating layer 12 so that a part of the silicon substrate 11 is shown through the contact hole 13. A deposition seed layer 14 is entirely formed which extends on a top surface of the insulating layer 12 and also on a vertical wall of the contact hole 13 as well as on the bottom of the contact hole 13. The deposition seed layer 14 may comprise a titanium layer, a titanium nitride layer, a silicon layer, a titanium tetrachloride adsorption layer, a terra-quis-dimethyl-amino-titanium adsorption layer, a titanium silicide layer, a tungsten silicide layer, a vanadium layer, a hafnium layer, a niobium layer, a tantrum layer or a platinum layer.

Figure 5B:
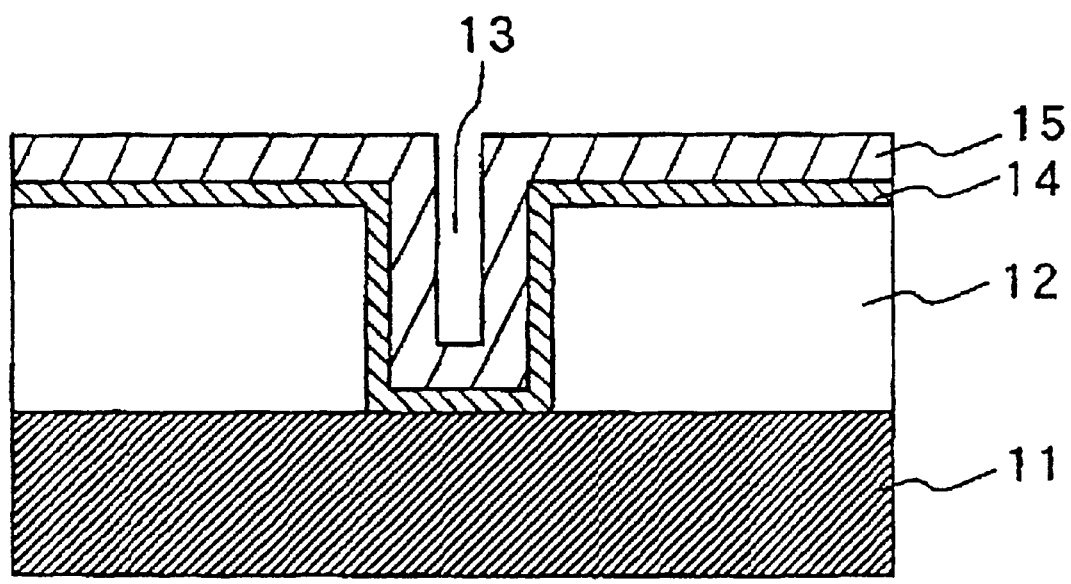

With reference to FIG. 5B, a chemical vapor deposition method is carried out to entirely deposit a thin aluminum layer 15 on the deposition seed layer 14 so that the thin aluminum layer 15 extends over the surface of the insulating layer 12 and in the contact hole 13. If the contact hole has a diameter of 0.16 micrometers, then the thin aluminum layer 15 has a thickness of 0.07 micrometers which is less than a half of the diameter of the contact hole 13. The chemical vapor deposition may be carried out by use of a source gas, for example, dimethylaluminumhydride $(CH_3)_2AlH$ and a carrier gas of hydrogen at a flow rate in the range of 50–200 sccm at a substrate temperature in the range of 100–300° C.

Figure 5C:
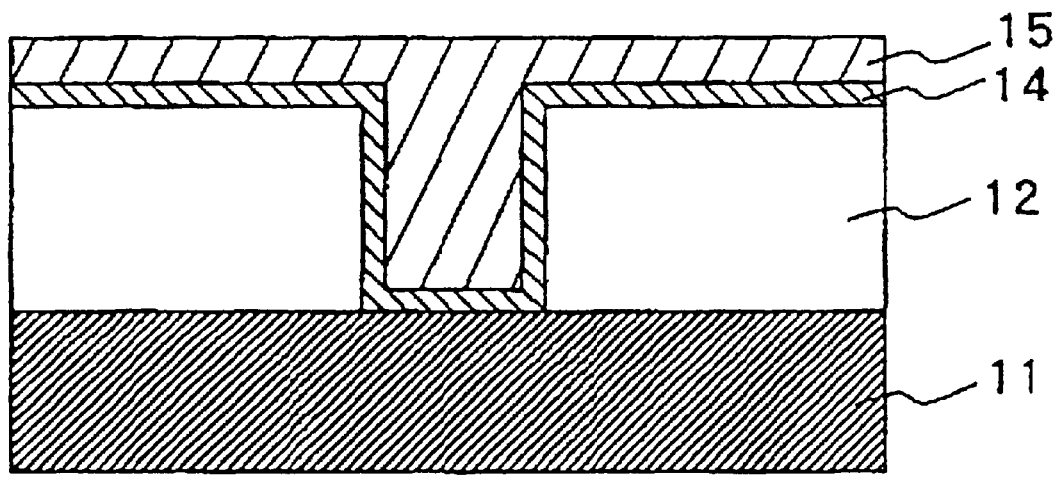

With reference to FIG. 5C, such atmosphere as to prevent the formation of the natural oxide film on the deposited aluminum layer 15 is maintained, wherein a partial pressure of oxidizing gas such as oxygen or water is suppressed at not higher than $1 \times 10^{-7}$ Torr, and an Ar gas is flowed at a flow rate in the range of 10–200 sccm, and a pressure in the bottom side of the silicon substrate 11 is maintained at 120 Torr. Under the above conditions, the substrate temperature is increased to be maintained in the range of 300–400° C. to cause a re-flow of the deposited aluminum layer 15 so that the contact hole 13 is completely filled with the re-flowed aluminum layer 15. The aluminum layer 15 is patterned by a lithography process to form a mask and subsequent dry etching process using the mask, thereby forming an aluminum interconnection and a void free aluminum contact layer within the contact hole 13.

Figure 6A:
FIG. 6A is a scanning electron microscope photo print illustrative of the deposited aluminum layer before re-flow process of FIG. 5B.
Figure 6B:
FIG. 6B is a scanning electron microscope photo print illustrative of the re-flowed aluminum layer after re-flow process of FIG. 5C, wherein the re-flow process is carried out at 350° C.

FIG. 6A is a scanning electron microscope photo print illustrative of the deposited aluminum layer before re-flow process of FIG. 5B and FIG. 6B is a scanning electron microscope photo print illustrative of the re-flowed aluminum layer after re-flow process of FIG. 5C, wherein the re-flow process is carried out at 350° C. Those photo prints show that the deposited aluminum layer before re-flow process fills not less than 75% by volume of the contact hole whilst the re-flowed aluminum layer after re-flow process fills 100% by volume of the contact hole, thereby forming the aluminum interconnection and the void free aluminum contact layer within the contact hole.

A second embodiment according to the present invention will be described in detail with reference to FIGS. 7A through 7D which are fragmentary cross sectional elevation views illustrative of a second novel method of forming an aluminum interconnection layer not only extending over an inter-layer insulator but also filling a contact hole formed in the inter-layer insulator to form a void free aluminum contact in a second embodiment in accordance with the present invention.

Figure 7A:
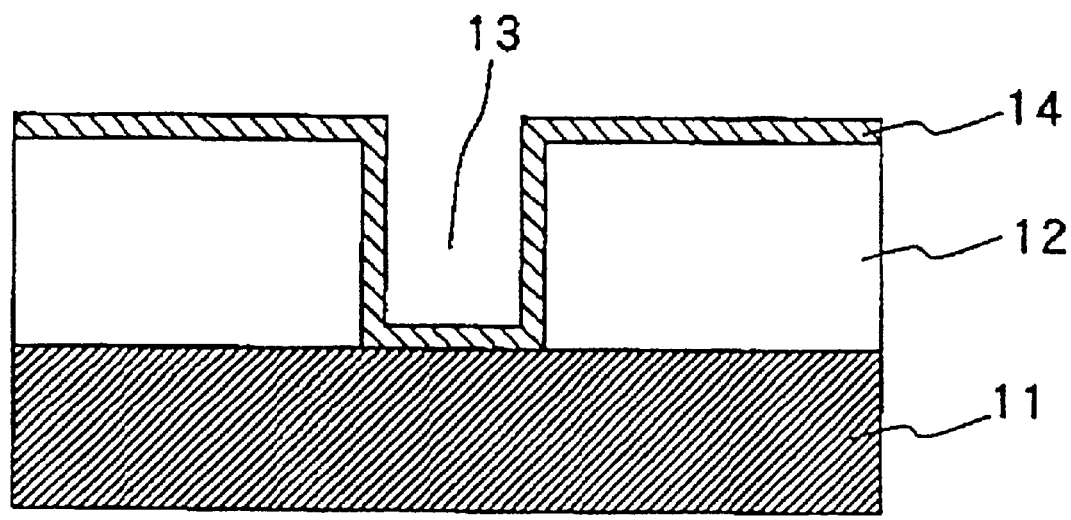
FIGS. 7A through 7D are fragmentary cross sectional elevation views illustrative of a second novel method of forming an aluminum interconnection layer not only extending over an inter-layer insulator but also filling a contact hole formed in the inter-layer insulator to form a void free aluminum contact in a second embodiment in accordance with the present invention.

With reference to FIG. 7A, an insulating layer 12 made of an insulating material such as silicon dioxide is formed on a silicon substrate 11. A contact hole 13 is formed in the insulating layer 12 so that a part of the silicon substrate 11 is shown through the contact hole 13. A deposition seed layer 14 is entirely formed which extends on a top surface of the insulating layer 12 and also on a vertical wall of the contact hole 13 as well as on the bottom of the contact hole 13. The deposition seed layer 14 may comprise a titanium layer, a titanium nitride layer, a silicon layer, a titanium tetrachloride adsorption layer, a terra-quis-dimethyl-amino-titanium adsorption layer, a titanium silicide layer, a tungsten silicide layer, a vanadium layer, a hafnium layer, a niobium layer, a tantrum layer or a platinum layer.

Figure 7B:
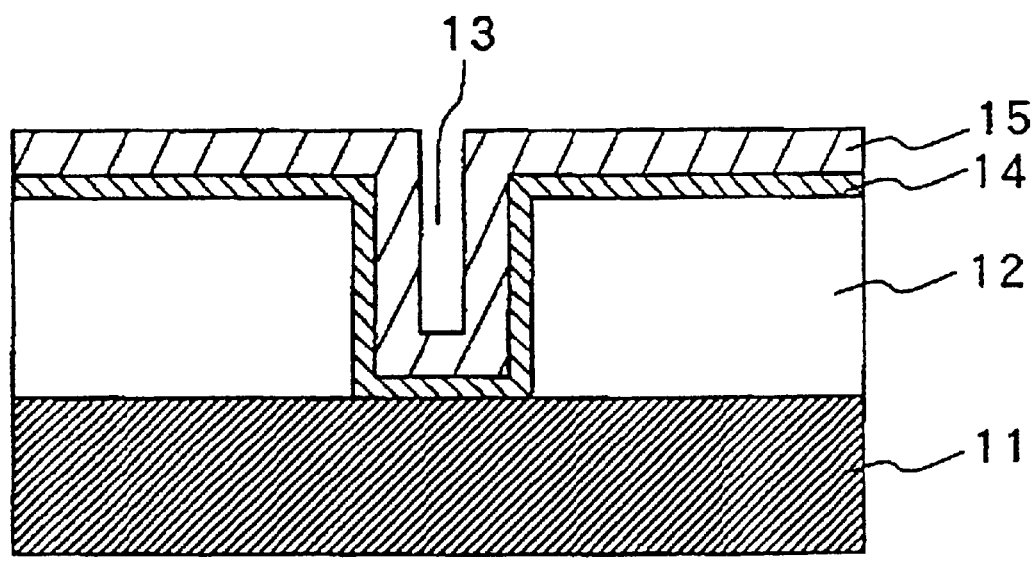

With reference to FIG. 7B, a chemical vapor deposition method is carried out to entirely deposit a thin aluminum layer 15 on the deposition seed layer 14 so that the thin aluminum layer 15 exceeds over the surface of the insulating layer 12 and in the contact hole 13. If the contact hole has a diameter of 0.16 micrometers, then the thin aluminum layer 15 has a thickness of 0.07 micrometers which is less than a half of the diameter of the contact hole 13. The chemical vapor deposition may be carried out by use of a source gas, for example, dimethylaluminumhydride $(CH_3)_2AlH$ and a carrier gas of hydrogen at a flow rate in the range of 50–200 sccm at a substrate temperature in the range of 100–300° C.

Figure 7C:
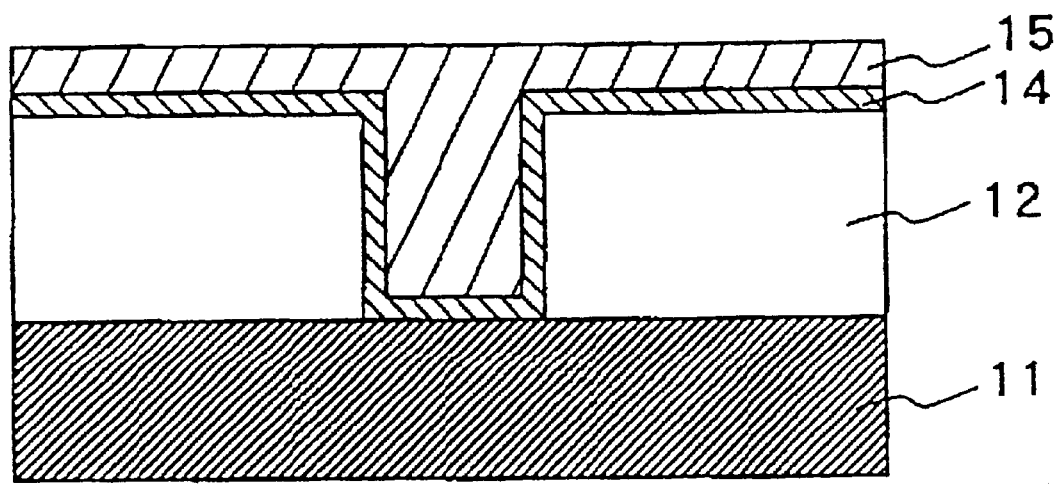

With reference to FIG. 7C, such the atmosphere as to prevent the formation of the natural oxide film on the deposited aluminum layer 15 is maintained, wherein a partial pressure of oxidizing gas such as oxygen or water is suppressed at not higher than $1 \times 10^{-7}$ Torr, and an Ar gas is flowed at a flow rate in the range of 10–200 sccm, and a pressure in the bottom side of the silicon substrate 11 is maintained at 120 Torr. Under the above conditions, the substrate temperature is increased to be maintained in the range of 300–400° C. to cause a re-flow of the deposited aluminum layer 15 so that the contact hole 13 is completely filled with the re-flowed aluminum layer 15.

Figure 7D:
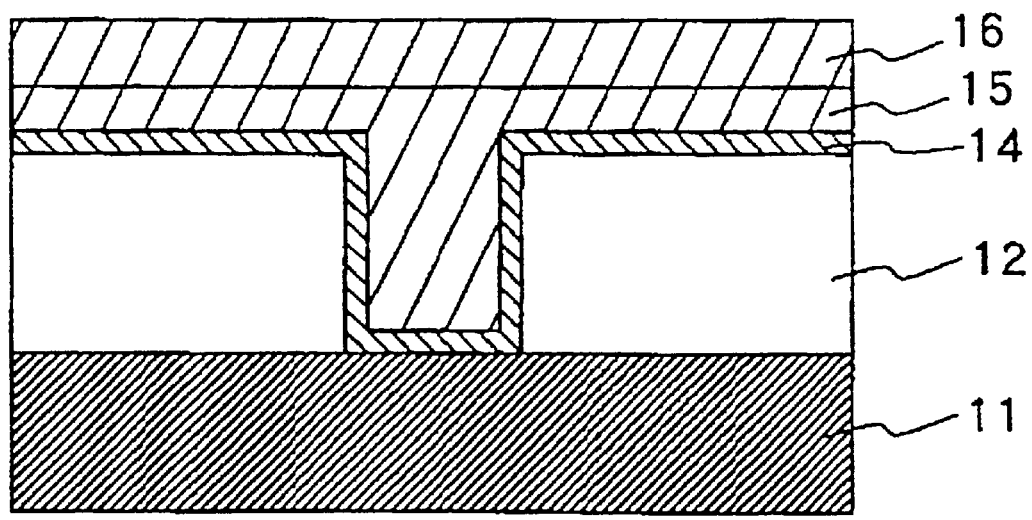

With reference to FIG. 7D, the vacuum condition is maintained under which a sputtering process and subsequent heat treatment or a high temperature sputtering process is then carried out to deposit an aluminum or an aluminum alloy layer 16 on the aluminum layer 15 to increase the thickness of the interconnection layer. If the physically deposited aluminum alloy layer 16 includes coppers, then coppers may be diffused into the chemically deposited aluminum layer 15 to form an aluminum alloy layer 15 which is highly stable to an electro-migration. If the copper concentration in the physically deposited aluminum alloy layer 16 is about 1% by weight, then laminations of the chemically deposited aluminum based layer 15 and the physically deposited aluminum based layer 15 are patterned without formation of any remainders by a lithography process to form a mask and subsequent dry etching process using the mask, thereby forming an aluminum interconnection and a void free aluminum-based contact layer within the contact hole 13.

A third embodiment according to the present invention will be described in detail with reference to FIGS. 8A through 8D which are fragmentary cross sectional elevation views illustrative of a third novel method of forming an aluminum interconnection layer not only extending over an inter-layer insulator but also filling a contact hole and a groove formed in the inter-layer insulator to form a void free aluminum contact and a void free damascene interconnection within the groove in a third embodiment in accordance with the present invention.

Figure 8A:
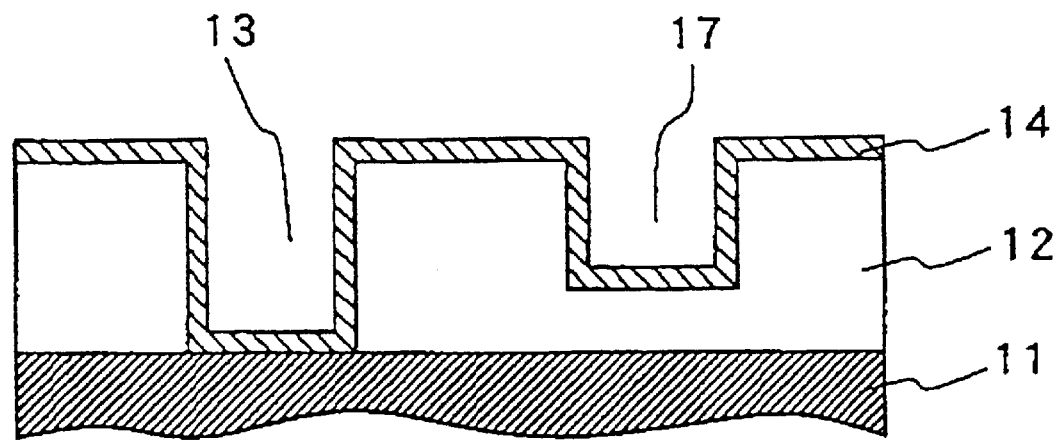
FIGS. 8A through 8D are fragmentary cross sectional elevation views illustrative of a third novel method of forming an aluminum interconnection layer not only extending over an inter-layer insulator but also filling a contact hole and a groove formed in the inter-layer insulator to form a void free aluminum contact and a void free damascene interconnection within the groove in a third embodiment in accordance with the present invention.

With reference to FIG. 8A, an insulating layer 12 made of an insulating material such as silicon dioxide is formed on a silicon substrate 11. A contact hole 13 and a groove are 17 formed in the insulating layer 12 so that a part of the silicon substrate 11 is shown through the contact hole 13. The contact hole has a diameter of 0.18 micrometers, whilst the groove 17 is a width of 0.18 micrometers. A deposition seed layer 14 having a thickness in the range of 10–30 nanometers is entirely deposited by a DC-sputtering method at a DC power in the range of 1–5 kW, and an Ar gas flow rate in the range of 30–200 sccm and a pressure in the range of 1–20 Torr, so that the deposition seed layer 14 extends on a top surface of the insulating layer 12 and also on vertical walls on the contact hole 13 and the groove 17 as well as on the bottoms of the contact hole 13 and the groove 17. The deposition seed layer 14 comprises a titanium layer. Notwithstanding the deposition seed layer 14 may alternatively comprise a titanium nitride layer, a silicon layer, a titanium tetrachloride adsorption layer, a terra-quis-dimethyl-aminotitanium adsorption layer, a titanium silicide layer, a tungsten silicide layer, a vanadium layer, a hafnium layer, a niobium layer, a tantrum layer or a platinum layer.

Figure 8B:
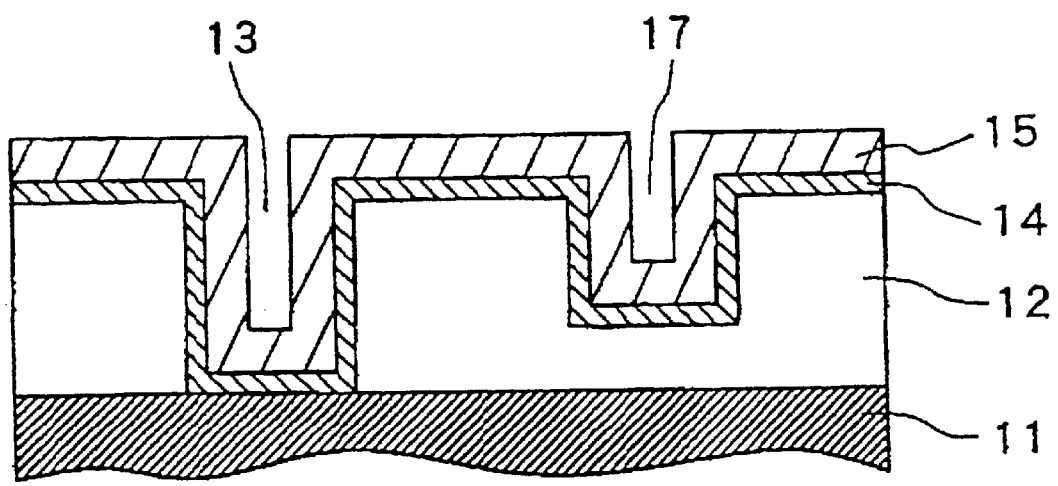

With reference to FIG. 8B, a chemical vapor deposition method is carried out to entirely deposit a thin aluminum layer 15 on the deposition seed layer 14 so that the thin aluminum layer 15 extends over the surface of the insulating layer 12 and in the contact hole 13. The thin aluminum layer 15 has a thickness of 0.06 micrometers which is less than a half of the diameter of the contact hole 13 or less than half of the width of the groove 17. The chemical vapor deposition may be carried out by use of a source gas, for example, dimethylaluminumhydride $(CH_3)_2AlH$ and a carrier gas of hydrogen at a flow rate in the range of 50–200 sccm at a substrate temperature in the range of 100–300° C.

Figure 8C:
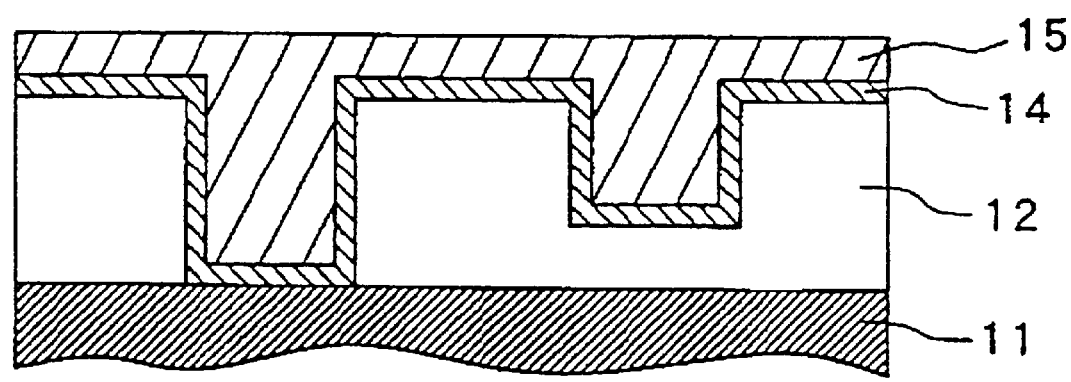

With reference to FIG. 8C, such the atmosphere as to prevent the formation of the natural oxide film on the deposited aluminum layer 15 is maintained, where a partial pressure of oxidizing gas such as oxygen or water is suppressed at not higher than $1\times10^{-8}$Torr, and an Ar gas is flowed at a flow rate in the range of 10–200 sccm, and a pressure in the bottom side of the silicon substrate 11 is maintained at 120Torr. Under the above conditions, the substrate temperature is increased to a temperature in the range of 300–400° C. for 10 seconds and then maintained at that temperature to cause a re-flow of the deposited aluminum layer 15 so that the contact hole 13 and the groove 17 are simultaneously and completely filled with the re-flowed aluminum layer 15.

Figure 8D:
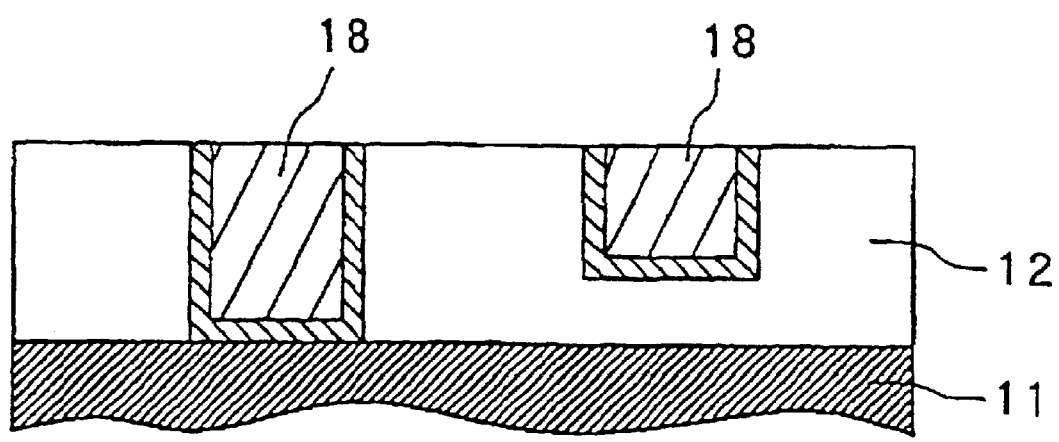

With reference to FIG. 8D, a chemical mechanical polishing process is carried out by use of an silicon dioxide slurry or an alumina slurry under the standard or normal conditions, then a damascene interconnection is formed in the groove 17, thereby forming a void free aluminum-based contact layer 18 within the contact hole 13 and a void free damascene interconnection 18 within the groove 17.

A fourth embodiment according to the present invention will be described in detail with reference to FIGS. 9A through 9E which are fragmentary cross sectional elevation views illustrative of a fourth novel method of forming an aluminum interconnection layer not only extending over an inter-layer insulator but also filling a contact hole and a groove formed in the inter-layer insulator to form a void free aluminum contact and a void free damascene interconnection within the groove in a fourth embodiment in accordance with the present invention.

Figure 9A:
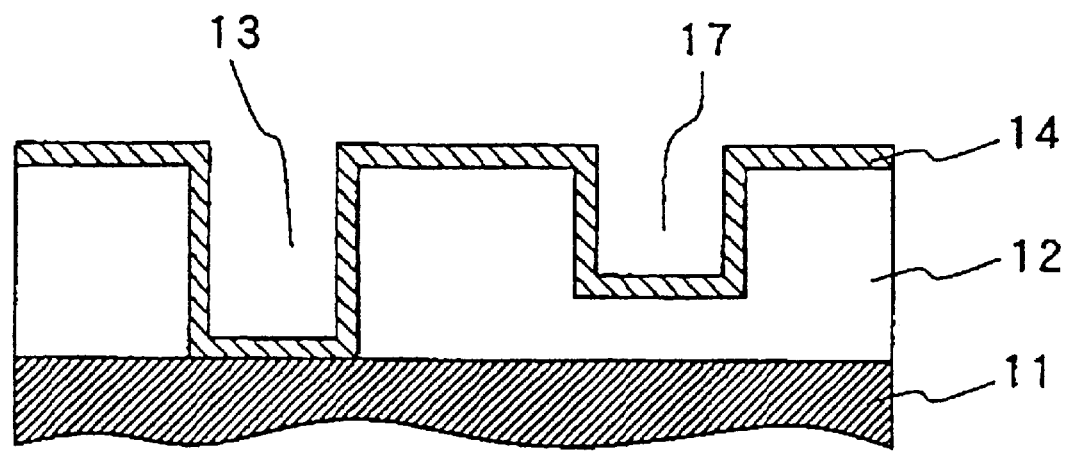
FIGS. 9A through 9E are fragmentary cross sectional elevation views illustrative of a fourth novel method of forming an aluminum interconnection layer not only extending over an inter-layer insulator but also filling a contact hole and a groove formed in the inter-layer insulator to form a void free aluminum contact and a void free damascene interconnection within the groove in a fourth embodiment in accordance with the present invention.

With reference to FIG. 9A, an insulating layer 12 made of an insulating material such as silicon dioxide is formed on a silicon substrate 11. A contact hole 13 and a groove are 17 formed in the insulating layer 12 so that a part of the silicon substrate 11 is shown through the contact hole 13. The contact hole has a diameter of 0.18 micrometers, whilst the groove 17 is a width of 0.18 micrometers. A deposition seed layer 14 having a thickness in the range of 10–30 nanometers is entirely deposited by a DC-sputtering method at a DC power in the range of 1–5 kW, and an Ar gas flow rate in the range of 30–200 sccm and a pressure in the range of 1–20 Torr, so that the deposition seed layer 14 extends on a top surface of the insulating layer 12 and also on vertical walls of the contact hole 13 and the groove 17 as well as on the bottoms of the contact hole 13 and the groove 17. The deposition seed layer 14 comprises a titanium layer. Notwithstanding the deposition seed layer 14 may alternatively comprise a titanium nitride layer, a silicon layer, a titanium tetrachloride adsorption layer, a terra-quis-dimethyl-amino-titanium adsorption layer, a titanium silicide layer, a tungsten silicide layer, a vanadium layer, a hafnium layer, a niobium layer, a tantrum layer or a platinum layer.

Figure 9B:
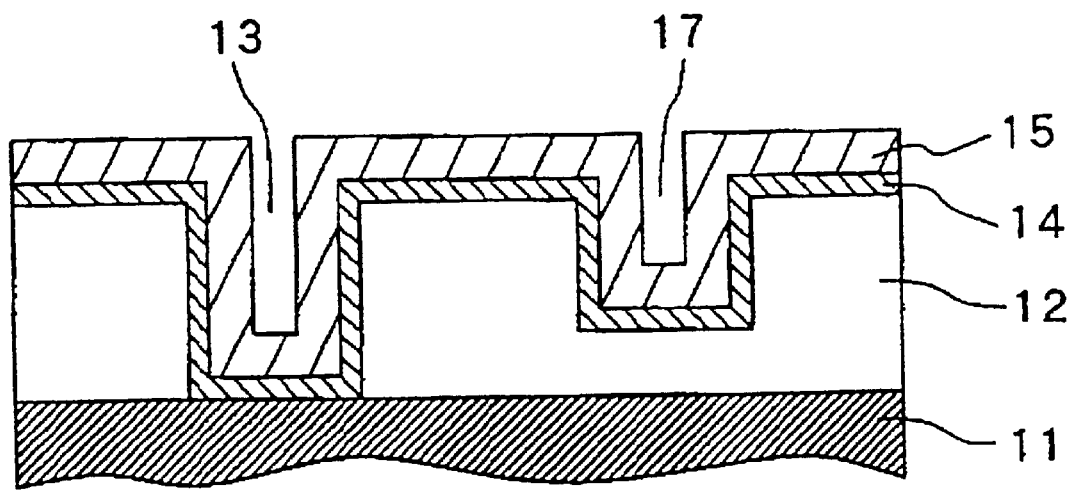

With reference to FIG. 9B, a chemical vapor deposition method is carried out to entirely deposit a thin aluminum layer 15 on the deposition seed layer 14 so that the thin aluminum layer 15 extends over the surface of the insulating layer 12 and in the contact hole 13. The thin aluminum layer 15 has a thickness of 0.06 micrometers which is less than a half of the diameter of the contact hole 13 or less than a half of the width of the groove 17. The chemical vapor deposition may be carried out by use of a source gas, for example, dimethylaluminumhydride $(CH_3)_2AlH$ and a carrier gas of hydrogen at a flow rate in the range of 50–200 sccm at a substrate temperature in the range of 100–300° C.

Figure 9C:
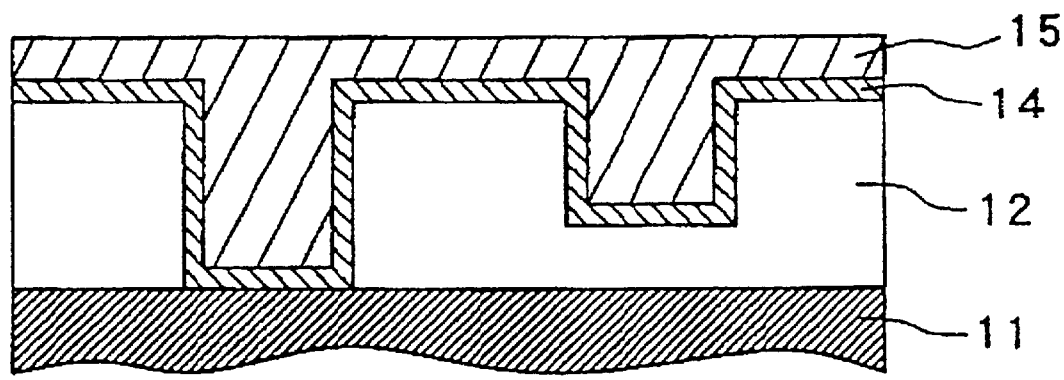

With reference to FIG. 9C, such the atmosphere as to prevent the formation of the natural oxide film on the deposited aluminum layer 15 is maintained, where a partial pressure of oxidizing gas such as oxygen or water is suppressed at not higher than $1\times10^{-8}$Torr, and an Ar gas is flowed at a flow rate in the range of 10–200 sccm, and a pressure in the bottom side of the silicon substrate 11 is maintained at 120Torr. Under the above conditions, the substrate temperature is increased to a temperature in the range of 300–400° C. for 10 seconds and then maintained at that temperature to cause a re-flow of the deposited aluminum layer 15 so that the contact hole 13 and the groove 17 are simultaneously and completely filled with the re-flowed aluminum layer 15.

Figure 9D:
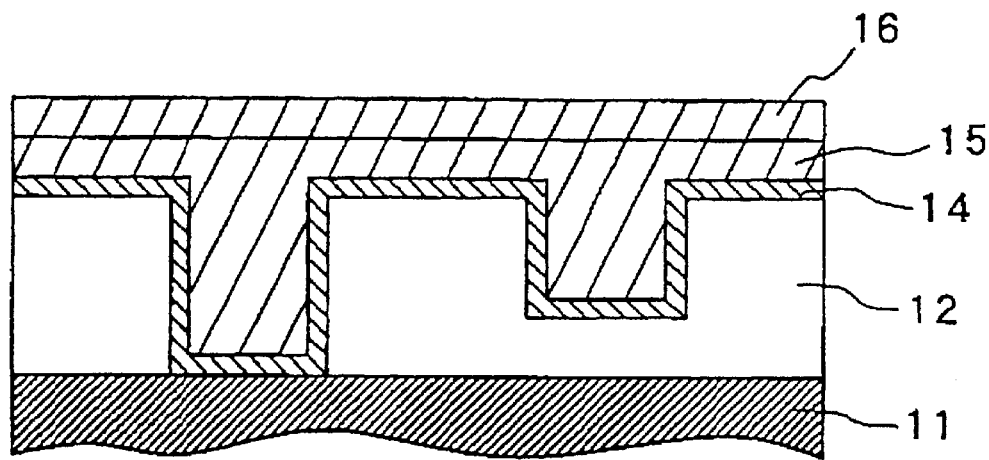

With reference to FIG. 9D, the vacuum condition is maintained under which a sputtering process and subsequent heat treatment or a high temperature sputtering process is then carried out by use of a copper-containing aluminum target which contains 4% by weight of copper at a substrate temperature of 400° C. and an Ar gas flow rate in the range of 50–300 sccm and under a pressure in the range of 1–10 mTorr, and a DC-power in the range of 5–30 kW. An aluminum alloy layer 16 is deposited by the above sputtering process on the aluminum layer 15 to increase the thickness of the interconnection layer. Coppers are diffused into the chemically deposited aluminum layer 15 to form an aluminum alloy layer 15 which is highly stable to an electromigration.

Figure 9E:
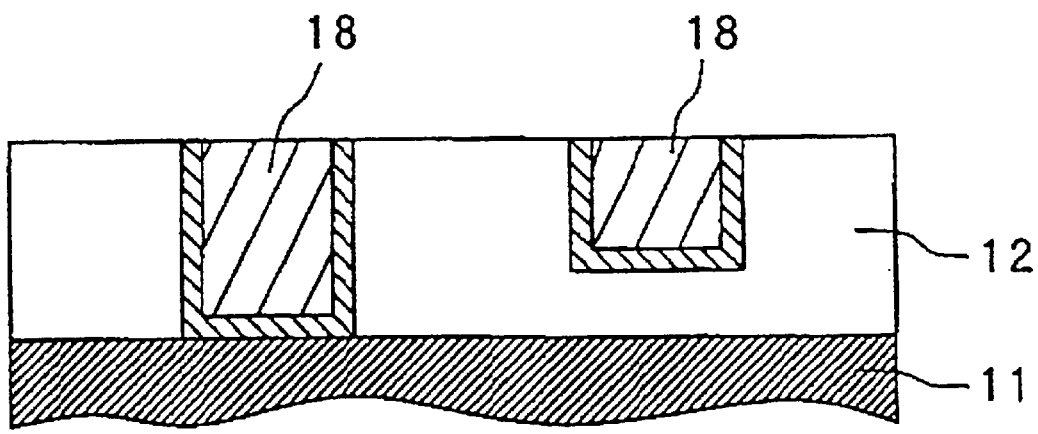

With reference to FIG. 9E, a chemical mechanical polishing process is carried out by use of an silicon dioxide slurry or an alumina slurry under the standard or normal conditions, then a damascene interconnection is formed in the groove 17, thereby forming a void free aluminum-based contact layer 18 within the contact hole 13 and a void free damascene interconnection 18 within the groove 17.

A fifth embodiment according to the present invention will be described in detail with reference to FIGS. 19A through 10C which are fragmentary cross sectional elevation views illustrative of a fifth novel method of forming an aluminum interconnection layer not only extending over an inter-layer insulator but also filling a contact and a wide groove formed in the inter-layer insulator to form a void free aluminum contact and a void free damascene interconnection within the wide groove in a fifth embodiment in accordance with the present invention.

Figure 10A:
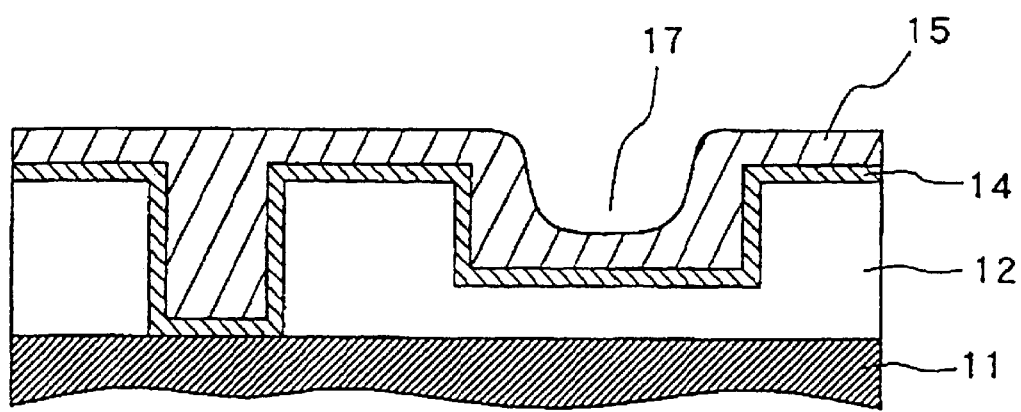
FIGS. 10A through 10C are fragmentary cross sectional elevation views illustrative of a fifth novel method of forming an aluminum interconnection layer not only extending over an inter-layer insulator but also filling a contact hole and a wide groove formed in the inter-layer insulator to form a void free aluminum contact and a void free damascene interconnection within the wide groove in a fifth embodiment in accordance with the present invention.

With reference to FIG. 10A, an insulating layer 12 made of an insulating material such as silicon dioxide is formed on a silicon substrate 11. A contact hole 13 and a groove are 17 formed in the insulating layer 12 so that a part of the silicon substrate 11 is shown through the contact hole 13. The contact hole has a diameter of 0.18 micrometers, whilst the wide groove 17 is a width of 0.36 micrometers. A deposition seed layer 14 having a thickness in the range of 10–30 nanometers is entirely deposited by a DC-sputtering method at a DC power in the range of 1–5 kW, and an Ar gas flow rate in the range of 30–200 sccm and a pressure in the range of 1–20 Torr, so that the deposition seed layer 14 extends on a top surface of the insulating layer 12 and also on vertical walls of the contact hole 13 and the groove 17 as well as on the bottoms of the contact hole 13 and the groove 17. The deposition seed layer 14 comprises a titanium layer. Notwithstanding the deposition seed layer 14 may alternatively comprise a titanium nitride layer, a silicon layer, a titanium tetrachloride adsorption layer, a terra-quis-dimethyl-amino-titanium adsorption layer, a titanium silicide layer, a tungsten silicide layer, a vanadium layer, a hafnium layer, a niobium layer, a tantrum layer or a platinum layer.

A chemical vapor deposition methods is carried out to entirely deposit a thin aluminum layer 15 on the deposition seed layer 14 so that the thin aluminum layer 15 extends over the surface of the insulating layer 12 and in the contact hole 13. The thin aluminum layer 15 has a thickness of 0.06 micrometers which is less than a half of the diameter of the contact hole 13 or less than one quarter of the width of the wide groove 17. The chemical vapor deposition may be carried out by use of a source gas, for example, dimethylaluminumhydride $(CH_3)_2AlH$ and a carrier gas of hydrogen at a flow rate in the range of 50–200 sccm at a substrate temperature in the range of 100–300° C.

Such the atmosphere as to prevent the formation of the natural oxide film on the deposited aluminum layer 15 is maintained, wherein a partial pressure of oxidizing gas such as oxygen or water is suppressed at not higher than $1\times10^{-8}$ Torr, and an Ar gas is flowed at a flow rate in the range of 10–200 sccm, and a pressure in the bottom side of the silicon substrate 11 is maintained at 120Torr. Under the above conditions, the substrate temperature is increased to a temperature in the range of 300–400° C. for 10 seconds and then maintained at that temperature to cause a re-flow of the deposited aluminum layer 15 so that only the contact hole 13 is completely filled with the re-flowed aluminum layer 15 whilst the wide groove 17 is incompletely filled with the re-flowed aluminum layer 15 due to its large width.

Figure 10B:
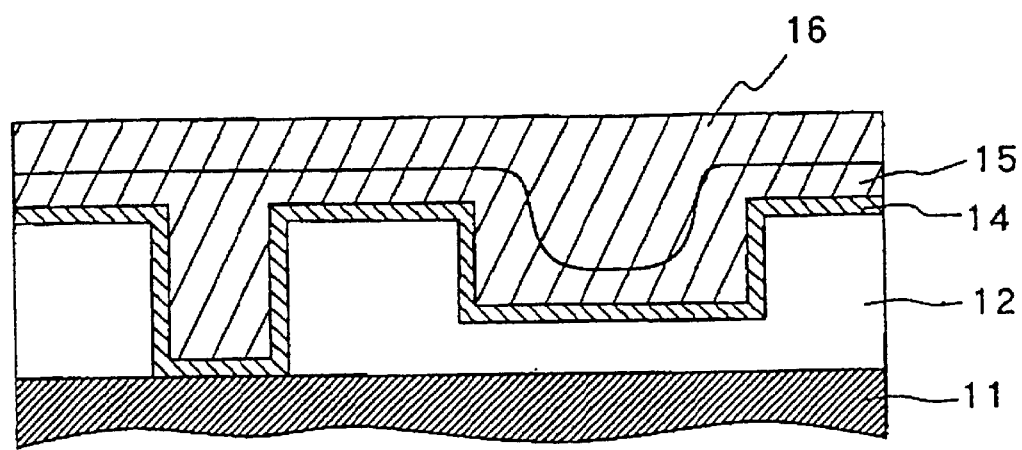

With reference to FIG. 10B, the vacuum condition is maintained under which a sputtering process and subsequent heat treatment or a high temperature sputtering process is then carried out by use of a copper-containing aluminum target which contains 4% by weight of copper at a substrate temperature of 400° C. and an Ar gas flow rate in the range of 50–300 sccm and under a pressure in the range of 1–10 mTorr, and a DC-power in the range of 5–30 kW. An aluminum alloy layer 16 is deposited by the above sputtering process on the aluminum layer 15 not only to increase the thickness of the interconnection layer but also to completely fill the wide groove 17. Coppers are diffused into the chemically deposited aluminum layer 15 to form an aluminum alloy layer 15 which is highly stable to an electromigration.

Figure 10C:
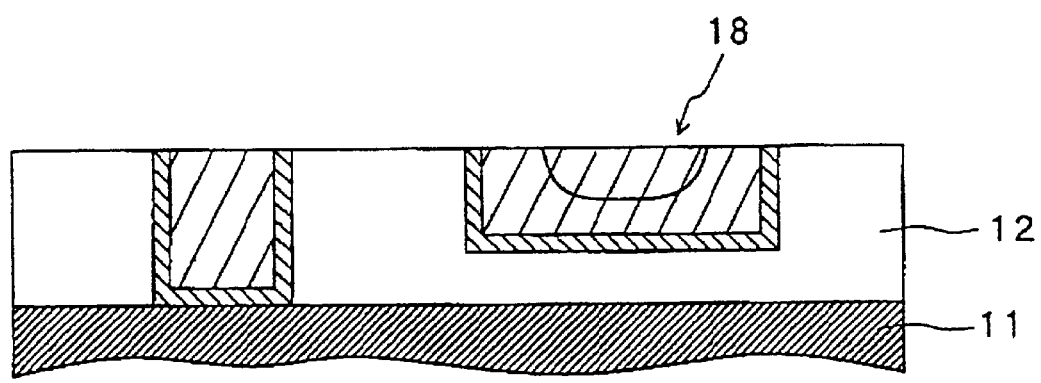

With reference to FIG. 10C, a chemical mechanical polishing process is carried out by use of an silicon dioxide slurry or an alumina slurry under the standard or normal conditions, then a damascene interconnection is formed in the groove 17, thereby forming a void free aluminum-based contact layer 18 within the contact hole 13 and a void free damascene interconnection 18 within the groove 17.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A method of forming an aluminum-based layer mainly including aluminum on a surface of an insulating layer and within a hole formed in said insulating layer, said method comprising the steps of:

carrying out a chemical vapor deposition to deposit said aluminum-based layer on said surface of said insulating layer and also to incompletely fill said hole to not less than 75% by volume of the hole by use of a source including at least one of alkyl groups and hydrogen so that a surface of said aluminum-based layer is terminated by said at least one of alkyl groups and hydrogen included in said source, and so that said surface of said aluminum-based layer is free of any natural oxide film; and carrying out a heat treatment, without formation of any natural oxide film on said surface of said aluminum-based layer, for causing a re-flow of said aluminum-based layer, whereby said at least one of alkyl groups and hydrogen promotes a migration of aluminum atoms on said surface of said aluminum-based layer.

2. The method as claimed in claim 1, wherein, following to said chemical vapor deposition, said heat treatment is carried out under a partial pressure of not higher than $1\times10^{-7}$ Torr of a gas capable of oxidation to said aluminum-based layer.

3. The method as claimed in claim 2, wherein said partial pressure of said gas capable of oxidation to said aluminum-based layer is not higher than $1\times10^{-8}$ Torr.

4. The method as claimed in claim 1, wherein, following to said chemical vapor deposition, said heat treatment is carried out in a vacuum.

5. The method as claimed in claim 4, wherein said heat treatment is carried out in a vacuum chamber used for said chemical vapor deposition.

6. The method as claimed in claim 1, wherein, following to said chemical vapor deposition, said heat treatment is carried out at a temperature in a range of 250–600° C.

7. The method as claimed in claim 6, wherein said temperature of said heat treatment is in a range of 270–500° C.

8. The method as claimed in claim 7, wherein said temperature of said heat treatment is in a range of 330–450° C.

9. The method as claimed in claim 1, wherein said aluminum-based layer is deposited to have a thickness which is less than a half of a minimum horizontal size of said hole.

10. The method as claimed in claim 1, further comprising a step of forming, prior to said chemical vapor deposition, a thin base layer on said surface of said insulating layer and on vertical walls of said hole as well as on a bottom of said hole, wherein said thin base layer is made of a material which is capable of serving as a seed for subsequently carrying out said chemical vapor deposition to deposit said aluminum-based layer on said thin base layer.

11. The method as claimed in claim 10, wherein said thin base layer is made of a material selected from the group consisting of titanium, titanium nitride, silicon, titanium tetrachloride, terra-quis-dimethyl-amino-titanium, titanium silicide, tungsten silicide, vanadium, hafnium, niobium, tantrum and platinum.

12. The method as claimed in claim 1, further comprising a step of carrying out, following to said chemical vapor deposition, a physical vapor deposition of a secondary aluminum-based layer on said aluminum-based layer deposited by said chemical vapor deposition.

13. The method as claimed in claim 12, wherein said physical vapor deposition is made by a sputtering process by use of an aluminum target to deposit said secondary aluminum-based layer which comprises an aluminum layer.

14. The method as claimed in claim 12, wherein said physical vapor deposition is made by a sputtering process by use of a copper-containing aluminum target to deposit said secondary aluminum-based layer which comprises a copper containing aluminum layer.

15. The method as claimed in claim 14, wherein a concentration of copper in said copper containing aluminum layer is about 1% by weight.

16. The method as claimed in claim 14, wherein said sputtering process is carried out at a sufficiently high temperature for causing a diffusion of copper atoms from said secondary aluminum-based layer into said aluminum-based layer deposited by said chemical vapor deposition.

17. The method as claimed in claim 14, further comprising a step of carrying out a secondary heat treatment, after said sputtering process, to cause a diffusion of copper atoms from said secondary aluminum-based layer into said aluminum-based layer deposited by said chemical vapor deposition.

18. The method as claimed in claim 12, further comprising a step of carrying out, after said physical vapor deposition, a chemical mechanical polishing to laminations of said aluminum-based layer deposited by said chemical vapor deposition and said secondary aluminum-based layer deposited by said physical vapor deposition so that said laminations remain only within said hole.

19. The method as claimed in claim 1, further comprising a step of carrying out, after said heat treatment, a chemical mechanical polishing to said aluminum-based layer so as to remain only within said hole.

20. A method of forming an aluminum-based layer mainly including aluminum on a surface of an insulating layer and within a groove formed in said insulating layer, said method comprising the steps of:
carrying out a chemical vapor deposition to deposit said aluminum-based layer on said surface of said insulating layer and also to incompletely fill said groove to not less than 75% by volume of the groove by use of a source including at least one of alkyl groups and hydrogen so that a surface of said aluminum-based layer is terminated by said at least one of alkyl groups and hydrogen included in said source, and so that said surface of said aluminum-based layer is free of any natural oxide film; and
carrying out a heat treatment, without formation of any natural oxide film on said surface of said aluminum-based layer, for causing a re-flow of said aluminum-based layer, whereby said at least one of alkyl groups and hydrogen promotes a migration of aluminum atoms on said surface of said aluminum-based layer.

21. The method as claimed in claim 20, wherein, following to said chemical vapor deposition, said heat treatment is carried out under a partial pressure of not higher than $1 \times 10^{-7}$ Torr of a gas capable of oxidation to said aluminum-based layer.

22. The method as claimed in claim 21, wherein said partial pressure of said gas capable of oxidation to said aluminum-based layer is not higher than $1 \times 10^{-8}$ Torr.

23. The method as claimed in claim 20, wherein, following to said chemical vapor deposition, said heat treatment is carried out in a vacuum.

24. The method as claimed in claim 23, wherein said heat treatment is carried out in a vacuum chamber used for said chemical vapor deposition.

25. The method as claimed in claim 20, wherein, following to said chemical vapor deposition, said heat treatment is carried out at a temperature in a range of 250–600° C.

26. The method as claimed in claim 25, wherein said temperature of said heat treatment is in a range of 270–500° C.

27. The method as claimed in claim 26, wherein said temperature of said heat treatment is in a range of 330–450° C.

28. The method as claimed in claim 20, wherein said aluminum-based layer is deposited to have a thickness which is less than a half of a minimum horizontal size of said groove.

29. The method as claimed in claim 20, further comprising a step of forming, prior to said chemical vapor deposition, a thin base layer on said surface of said insulating layer and on vertical walls of said groove as well as on a bottom of said groove, wherein said thin base layer is made of a material which is capable of serving as a seed for subsequently carrying out said chemical vapor deposition to deposit said aluminum-based layer on said thin base layer.

30. The method as claimed in claim 29, wherein said thin base layer is made of a material selected from the group consisting of titanium, titanium nitride, silicon, titanium tetrachloride, terra-quis-dimethyl-amino-titanium, titanium silicide, tungsten silicide, vanadium, hafnium, niobium, tantrum and platinum.

31. The method as claimed in claim 20, further comprising a step of carrying out, following to said chemical vapor deposition, a physical vapor deposition of a secondary aluminum-based layer on said aluminum-based layer deposited by said chemical vapor deposition.

32. The method as claimed in claim 31, wherein said physical vapor deposition is made by a sputtering process by use of an aluminum target to deposit said secondary aluminum-based layer which comprises an aluminum layer.

33. The method as claimed in claim 31, wherein said physical vapor deposition is made by a sputtering process by use of a copper-containing aluminum target to deposit said secondary aluminum-based layer which comprises a copper containing aluminum layer.

34. The method as claimed in claim 33, wherein a concentration of copper in said copper containing aluminum layer is about 1% by weight.

35. The method as claimed in claim 33, wherein said sputtering process is carried out at a sufficiently high temperature for causing a diffusion of copper atoms from said secondary aluminum-based layer into said aluminum-based layer deposited by said chemical vapor deposition.

36. The method as claimed in claim 33, further comprising a step of carrying out a secondary heat treatment, after said sputtering process, to cause a diffusion of copper atoms from said secondary aluminum-based layer into said aluminum-based layer deposited by said chemical vapor deposition.

37. The method as claimed in claim 31, further comprising a step of carrying out, after said physical vapor deposition, a chemical mechanical polishing to laminations of said aluminum-based layer deposited by said chemical vapor deposition and said secondary aluminum-based layer deposited by said physical vapor deposition so that said laminations remain only within said groove.

38. The method as claimed in claim 20, further comprising a step of carrying out, after said heat treatment, a chemical mechanical polishing to said aluminum-based layer so as to remain only within said groove.

39. A method of forming an aluminum-based layer mainly including aluminum on a surface of an insulating layer and within a depression portion formed in said insulating layer, said method comprising the steps of:

carrying out a chemical vapor deposition to deposit said aluminum-based layer on said surface of said insulating layer and also to incompletely fill said depressed portion to not less than 75% by volume of the depressed portion by use of a source including at least one of alkyl groups and hydrogen so that a surface of said aluminum-based layer is terminated by said at least one of alkyl groups and hydrogen included in said source, and so that said surface of said aluminum-based layer is free of any natural oxide film; and carrying out a heat treatment, without formation of any natural oxide film on said surface of said aluminum-based layer, for causing a re-flow of said aluminum-based layer, whereby said at least one of alkyl groups and hydrogen promotes a migration of aluminum atoms on said surface of said aluminum-based layer.

40. The method as claimed in claim 39, wherein, following to said chemical vapor deposition, said heat treatment is carried out under a partial pressure of not higher than $1\times10^{-7}$ Torr of a gas capable of oxidation to said aluminum-based layer.

41. The method as claimed in claim 40, wherein said partial pressure of said gas capable of oxidation to said aluminum-based layer is not higher than $1\times10^{-8}$ Torr.

42. The method as claimed in claim 39, wherein, following to said chemical vapor deposition, said heat treatment is carried out in a vacuum.

43. The method as claimed in claim 42, wherein said heat treatment is carried out in a vacuum chamber used for said chemical vapor deposition.

44. The method as claimed in claim 39, wherein, following to said chemical vapor deposition, said heat treatment is carried out at a temperature in a range of 250–600° C.

45. The method as claimed in claim 44, wherein said temperature of said heat treatment is in a range of 270–500° C.

46. The method as claimed in claim 45, wherein said temperature of said heat treatment is in a range of 330–450° C.

47. The method as claimed in claim 39, wherein said aluminum-based layer is deposited to have a thickness which is less than a half of a minimum horizontal size of said depressed portion.

48. The method as claimed in claim 39, further comprising a step of forming, prior to said chemical vapor deposition, a thin base layer on said surface of said insulating layer and on vertical walls of said depressed portion as well as on a bottom of said depressed portion, wherein said thin base layer is made of a material which is capable of serving as a seed for subsequently carrying out said chemical vapor deposition to deposit said aluminum-based layer on said thin base layer.

49. The method as claimed in claim 48, wherein said thin base layer is made of a material selected from the group consisting of titanium, titanium nitride, silicon, titanium tetrachloride, terra-quis-dimethyl-amino-titanium, titanium silicide, tungsten silicide, vanadium, hafnium, niobium, tantrum and platinum.

50. The method as claimed in claim 39, further comprising a step of carrying out, following to said chemical vapor deposition, a physical vapor deposition of a secondary aluminum-based layer on said aluminum-based layer deposited by said chemical vapor deposition.

51. The method as claimed in claim 50, wherein said physical vapor deposition is made by a sputtering process by use of an aluminum target to deposit said secondary aluminum-based layer which comprises an aluminum layer.

52. The method as claimed in claim 50, wherein said physical vapor deposition is made by a sputtering process by use of a copper-containing aluminum target to deposit said secondary aluminum-based layer which comprises a copper containing aluminum layer.

53. The method as claimed in claim 52, wherein a concentration of copper in said copper containing aluminum layer is about 1% by weight.

54. The method as claimed in claim 52, wherein said sputtering process is carried out at a sufficiently high temperature for causing a diffusion of copper atoms from said secondary aluminum-based layer into said aluminum-based layer deposited by said chemical vapor deposition.

55. The method as claimed in claim 52, further comprising a step of carrying out a secondary heat treatment, after said sputtering process, to cause a diffusion of copper atoms from said secondary aluminum-based layer into said aluminum-based layer deposited by said chemical vapor deposition.

56. The method as claimed in claim 50, further comprising a step of carrying out, after said physical vapor deposition, a chemical mechanical polishing to laminations of said aluminum-based layer deposited by said chemical vapor deposition and said secondary aluminum-based layer deposited by said physical vapor deposition so that said laminations remain only within said depressed portion.

57. The method as claimed in claim 39, further comprising a step of carrying out, after said heat treatment, a chemical mechanical polishing to said aluminum-based layer so as to remain only within said depressed portion.

58. A method of forming an aluminum-based layer mainly including aluminum on a surface of an insulating layer over a substrate and within a hole formed in said insulating layer, said method comprising the steps of:

carrying out a chemical vapor deposition to deposit said aluminum-based layer on said surface of said insulating layer and also to incompletely fill said hole to not less than 75% by volume of the hole by use of a source including at least one of alkyl groups and hydrogen so that a surface of said aluminum-based layer is terminated by said at least one of alkyl groups and hydrogen included in said source, and so that said surface of said aluminum-based layer is free of any natural oxide film; and maintain said substrate, without fermentation of any natural oxide film on said surface of said aluminum-based layer, at a sufficiently high substrate temperature for causing a re-flow of said aluminum-based layer, whereby said at least one of alkyl groups and hydrogen promotes a migration of aluminum atoms on said surface of said aluminum-based layer.

59. The method as claimed in claim 58, wherein, following to said chemical vapor deposition, said substrate is maintained under a partial pressure of not higher than $1\times10^{-7}$ Torr of a gas capable of oxidation to said aluminum-based layer.

60. The method as claimed in claim 59, wherein said partial pressure of said gas capable of oxidation to said aluminum-based layer is not higher than $1\times10^{-8}$ Torr.

61. The method as claimed in claim 58, wherein, following to said chemical vapor deposition, said heat treatment is carried out in a vacuum.

62. The method as claimed in claim 61, wherein said substrate is maintained in a vacuum chamber used for said chemical vapor deposition.

63. The method as claimed in claim 58, wherein, following to said chemical vapor deposition, said substrate temperature is in a range of 250–600° C.

64. The method as claimed in claim 63, wherein said substrate temperature is in a range of 270–500° C.

65. The method as claimed in claim 64, wherein said substrate temperature is in a range of 330–450° C.

66. The method as claimed in claim 58, wherein said aluminum-based layer is deposited to have a thickness which is less than a half of a minimum horizontal size of said hole.

67. The method as claimed in claim 58, further comprising a step of forming, prior to said chemical vapor deposition, a thin base layer on said surface of said insulating layer and on vertical walls of said hole as well as on a bottom of said hole, wherein said thin base layer is made of a material which is capable of serving as a seed for subsequently carrying out said chemical vapor deposition to deposit said aluminum-based layer on said thin base layer.

68. The method as claimed in claim 67, wherein said thin base layer is made of a material selected from the group consisting of titanium, titanium nitride, silicon, titanium tetrachloride, terra-quis-dimethyl-amino-titanium, titanium silicide, tungsten silicide, vanadium, hafnium, niobium, tantrum and platinum.

69. The method as claimed in claim 58, further comprising a step of carrying out, following to said chemical vapor deposition, a physical vapor deposition of a secondary aluminum-based layer on said aluminum-based layer deposited by said chemical vapor deposition.

70. The method as claimed in claim 69, wherein said physical vapor deposition is made by a sputtering process by use of an aluminum target to deposit said secondary aluminum-based layer which comprises an aluminum layer.

71. The method as claimed in claim 69, wherein said physical vapor deposition is made by a sputtering process by use of a copper-containing aluminum target to deposit said secondary aluminum-based layer which comprises a copper containing aluminum layer.

72. The method as claimed in claim 71, wherein a concentration of copper in said copper containing aluminum layer is about 1% by weight.

73. The method as claimed in claim 71, wherein said sputtering process is carried out at a sufficiently high temperature for causing a diffusion of copper atoms from said secondary aluminum-based layer into said aluminum-based layer deposited by said chemical vapor deposition.

74. The method as claimed in claim 71, further comprising a step of carrying out a secondary heat treatment, after said sputtering process, to cause a diffusion of copper atoms from said secondary aluminum-based layer into said aluminum-based layer deposited by said chemical vapor deposition.

75. The method as claimed in claim 69, further comprising a step of carrying out, after said physical vapor deposition, a chemical mechanical polishing to laminations of said aluminum-based layer deposited by said chemical vapor deposition and said secondary aluminum-based layer deposited by said physical vapor deposition so that said laminations remain only within said hole.

76. The method as claimed in claim 58, further comprising a step of carrying out, after said heat treatment, a chemical mechanical polishing to said aluminum-based layer so as to remain only within said hole.

77. A method of forming an aluminum-based layer mainly including aluminum on a surface of an insulating layer over a substrate and within a groove formed in said insulating layer, said method comprising the steps of:

carrying out a chemical vapor deposition to deposit said aluminum-based layer on said surface of said insulating layer and also to incompletely fill said groove to not less than 75% by volume of the groove by use of a source including at least one of alkyl groups and hydrogen so that a surface of said aluminum-based layer is terminated by said at least one of alkyl groups and hydrogen included in said source, and so that said surface of said aluminum-based layer is free of any natural oxide film; and maintain said substrate, without formation of any natural oxide film on said surface of said aluminum-based layer, at a sufficiently high substrate temperature for causing a re-flow of said aluminum-based layer, whereby said at least one of alkyl groups and hydrogen promotes a migration of aluminum atoms on said surface of said aluminum-based layer.

78. The method as claimed in claim 77, wherein, following to said chemical vapor deposition, said substrate is maintained under a partial pressure of not higher than $1 \times 10^{-7}$ Torr of a gas capable of oxidation to said aluminum-based layer.

79. The method as claimed in claim 78, wherein said partial pressure of said gas capable of oxidation to said aluminum-based layer is not higher than $1 \times 10^{-8}$ Torr.

80. The method as claimed in claim 77, wherein, following to said chemical vapor deposition, said heat treatment is carried out in a vacuum.

81. The method as claimed in claim 80, wherein said substrate is maintained in a vacuum chamber used for said chemical vapor deposition.

82. The method as claimed in claim 77, wherein, following to said chemical vapor deposition, said substrate temperature is in a range of 250–600° C.

83. The method as claimed in claim 82, wherein said substrate temperature is in a range of 270–500° C.

84. The method as claimed in claim 83, wherein said substrate temperature is in a range of 330–450° C.

85. The method as claimed in claim 77, wherein said aluminum-based layer is deposited to have a thickness which is less than a half of a minimum horizontal size of said groove.

86. The method as claimed in claim 77, further comprising a step of forming, prior to said chemical vapor deposition, a thin base layer on said surface of said insulating layer and on vertical walls of said groove as well as on a bottom of said groove, wherein said thin base layer is made of a material which is capable of serving as a seed for subsequently carrying out said chemical vapor deposition to deposit said aluminum-based layer on said thin base layer.

87. The method as claimed in claim 86, wherein said thin base layer is made of a material selected from the group consisting of titanium, titanium nitride, silicon, titanium tetrachloride, terra-quis-dimethyl-amino-titanium, titanium silicide, tungsten silicide, vanadium, hafnium, niobium, tantrum and platinum.

88. The method as claimed in claim 77, further comprising a step of carrying out, following to said chemical vapor deposition, a physical vapor deposition of a secondary aluminum-based layer on said aluminum-based layer deposited by said chemical vapor deposition.

89. The method as claimed in claim 88, wherein said physical vapor deposition is made by a sputtering process by use of an aluminum target to deposit said secondary aluminum-based layer which comprises an aluminum layer.

90. The method as claimed in claim 88, wherein said physical vapor deposition is made by a sputtering process by use of a copper-containing aluminum target to deposit said secondary aluminum-based layer which comprises a copper containing aluminum layer.

91. The method as claimed in claim 90, wherein a concentration of copper in said copper containing aluminum layer is about 1% by weight.

92. The method as claimed in claim 90, wherein said sputtering process is carried out at a sufficiently high temperature for causing a diffusion of copper atoms from said secondary aluminum-based layer into said aluminum-based layer deposited by said chemical vapor deposition.

93. The method as claimed in claim 90, further comprising a step of carrying out a secondary heat treatment, after said sputtering process, to cause a diffusion of copper atoms from said secondary aluminum-based layer into said aluminum-based layer deposited by said chemical vapor deposition.

94. The method as claimed in claim 88, further comprising a step of carrying out, after said physical vapor deposition, a chemical mechanical polishing to laminations of said aluminum-based layer deposited by said chemical vapor deposition and said secondary aluminum-based layer deposited by said physical vapor deposition so that said laminations remain only within said groove.

95. The method as claimed in claim 77, further comprising a step of carrying out, after said heat treatment, a chemical mechanical polishing to said aluminum-based layer so as to remain only within said groove.

96. A method of forming an aluminum-based layer mainly including aluminum on a surface of an insulating layer over a substrate and within a depressed portion formed in said insulating layer, said method comprising the steps of:

carrying out a chemical vapor deposition to deposit said aluminum-based layer on said surface of said insulating layer and also to incompletely fill said depressed portion to not less than 75% by volume of the depressed portion by use of a source including at least one of alkyl groups and hydrogen so that a surface of said aluminum-based layer is terminated by said at least one of alkyl groups and hydrogen included in said source, and so that said surface of said aluminum-based layer is free of any natural oxide film; and maintain said substrate, without formation of any natural oxide film on said surface of said aluminum-based layer, at a sufficiently high substrate temperature for causing a re-flow of said aluminum-based layer, whereby said at least one of alkyl groups and hydrogen promotes a migration of aluminum atoms on said surface of said aluminum-based layer.

97. The method as claimed in claim 96, wherein, following to said chemical vapor deposition, said substrate is maintained under a partial pressure of not higher than $1 \times 10^{-7}$ Torr of a gas capable of oxidation to said aluminum-based layer.

98. The method as claimed in claim 97, wherein said partial pressure of said gas capable of oxidation to said aluminum-based layer is not higher than $1 \times 10^{-8}$ Torr.

99. The method as claimed in claim 96, wherein, following to said chemical vapor deposition, said heat treatment is carried out in a vacuum.

100. The method as claimed in claim 99, wherein said substrate is maintained in a vacuum chamber used for said chemical vapor deposition.

101. The method as claimed in claim 96, wherein, following to said chemical vapor deposition, said substrate temperature is in a range of 250–600° C.

102. The method as claimed in claim 101, wherein said substrate temperature is in a range of 270–500° C.

103. The method as claimed in claim 102, wherein said substrate temperature is in a range of 330–450° C.

104. The method as claimed in claim 96, wherein said aluminum-based layer is deposited to have a thickness which is less than a half of a minimum horizontal size of said depressed portion.

105. The method as claimed in claim 96, further comprising a step of forming, prior to said chemical vapor deposition, a thin base layer on said surface of said insulating layer and on vertical walls of said depressed portion as well as on a bottom of said depressed portion, wherein said thin base layer is made of a material which is capable of serving as a seed for subsequently carrying out said chemical vapor deposition to deposit said aluminum-based layer on said thin base layer.

106. The method as claimed in claim 105, wherein said thin base layer is made of a material selected from the group consisting of titanium, titanium nitride, silicon, titanium tetrachloride, terra-quis-dimethyl-amino-titanium, titanium silicide, tungsten silicide, vanadium, hafnium, niobium, tantrum and platinum.

107. The method as claimed in claim 96, further comprising a step of carrying out, following to said chemical vapor deposition, a physical vapor deposition of a secondary aluminum-based layer on said aluminum-based layer deposited by said chemical vapor deposition.

108. The method as claimed in claim 107, wherein said physical vapor deposition is made by a sputtering process by use of an aluminum target to deposit said secondary aluminum-based layer which comprises an aluminum layer.

109. The method as claimed in claim 107, wherein said physical vapor deposition is made by a sputtering process by use of copper-containing aluminum target to deposit said secondary aluminum-based layer which comprises a copper containing aluminum layer.

110. The method as claimed in claim 109, wherein a concentration of copper in said copper containing aluminum layer is about 1% by weight.

111. The method as claimed in claim 109, wherein said sputtering process is carried out at a sufficiently high temperature for causing a diffusion of copper atoms from said secondary aluminum-based layer into said aluminum-based layer deposited by said chemical vapor deposition.

112. The method as claimed in claim 109, further comprising a step of carrying out a secondary heat treatment, after said sputtering process, to cause a diffusion of copper atoms from said secondary aluminum-based layer into said aluminum-based layer deposited by said chemical vapor deposition.

113. The method as claimed in claim 107, further comprising a step of carrying out, after said physical vapor deposition, a chemical mechanical polishing to laminations of said aluminum-based layer deposited by said chemical vapor deposition and said secondary aluminum-based layer deposited by said physical vapor deposition so that said laminations remain only within said depressed portion.

114. The method as claimed in claim 96, further comprising a step of carrying out, after said heat treatment, a chemical mechanical polishing to said aluminum-based layer so as to remain only within said depressed portion.

\* \* \* \* \*